(12) United States Patent
Takishita et al.

(10) Patent No.: US 10,468,254 B2
(45) Date of Patent: Nov. 5, 2019

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Hiroshi Takishita, Matsumoto (JP); Takashi Yoshimura, Matsumoto (JP); Takahiro Tamura, Matsumoto (JP); Yuichi Onozawa, Matsumoto (JP); Akio Yamano, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/688,892

(22) Filed: Aug. 29, 2017

(65) Prior Publication Data

US 2018/0005829 A1    Jan. 4, 2018

Related U.S. Application Data

(63) Continuation of application No. PCT/JP2016/073199, filed on Aug. 5, 2016.

(30) Foreign Application Priority Data

Sep. 16, 2015    (JP) .................................. 2015-183143

(51) Int. Cl.
*H01L 21/265* (2006.01)
*H01L 29/861* (2006.01)
(Continued)

(52) U.S. Cl.
CPC .......... *H01L 21/265* (2013.01); *H01L 21/263* (2013.01); *H01L 21/26506* (2013.01);
(Continued)

(58) Field of Classification Search
CPC ................. H01L 21/265; H01L 21/263; H01L 21/26506; H01L 21/8222
See application file for complete search history.

(56) References Cited

U.S. PATENT DOCUMENTS

| 8,859,409 | B2 | 10/2014 | Neidhart et al. |
| 2007/0000427 | A1 | 1/2007 | Umeno et al. |

(Continued)

FOREIGN PATENT DOCUMENTS

| JP | 2006-344823 A | 12/2006 |
| JP | 2009-099705 A | 5/2009 |

(Continued)

OTHER PUBLICATIONS

International Search Report for International Patent Application No. PCT/JP2016/073199, issued by the Japan Patent Office dated Sep. 27, 2016.

*Primary Examiner* — Mark W Tornow

(57) ABSTRACT

Provided is a semiconductor device including: a semiconductor substrate doped with an impurity; a front-surface-side electrode provided at a side of a front surface of the semiconductor substrate; and a back-surface-side electrode provided at a side of a back surface of the semiconductor substrate; wherein the semiconductor substrate includes: a peak region arranged at the side of the back surface of the semiconductor substrate and having one or more peaks of an impurity concentration; a high concentration region arranged closer to the front surface than the peak region and having an impurity concentration more gently sloped than the one or more peaks; and a low concentration region arranged closer to the front surface than the high concentration region and having an impurity concentration lower than the impurity concentration of the high concentration region and a substrate concentration of the semiconductor substrate.

30 Claims, 23 Drawing Sheets

(51) Int. Cl.
*H01L 21/8222* (2006.01)
*H01L 27/06* (2006.01)
*H01L 21/263* (2006.01)
*H01L 29/32* (2006.01)
*H01L 29/36* (2006.01)
*H01L 29/739* (2006.01)

(52) U.S. Cl.
CPC ...... *H01L 21/8222* (2013.01); *H01L 27/0664* (2013.01); *H01L 29/32* (2013.01); *H01L 29/36* (2013.01); *H01L 29/7397* (2013.01); *H01L 29/861* (2013.01)

(56) References Cited

U.S. PATENT DOCUMENTS

| | | | |
|---|---|---|---|
| 2012/0267681 A1* | 10/2012 | Nemoto | H01L 21/263 257/139 |
| 2013/0001639 A1 | 1/2013 | Iwasaki et al. | |
| 2013/0075783 A1 | 3/2013 | Yamazaki et al. | |
| 2013/0248058 A1 | 9/2013 | Cleary | |
| 2014/0246755 A1 | 9/2014 | Yoshimura et al. | |
| 2014/0299915 A1 | 10/2014 | Kouno et al. | |
| 2014/0302621 A1* | 10/2014 | Niimura | H01L 21/263 438/14 |
| 2014/0357026 A1 | 12/2014 | Kobayashi et al. | |
| 2015/0371858 A1 | 12/2015 | Laven et al. | |

FOREIGN PATENT DOCUMENTS

| | | |
|---|---|---|
| JP | 2012-069861 A | 4/2012 |
| JP | 2013-074181 A | 4/2013 |
| JP | 2013-138172 A | 7/2013 |
| JP | 2016-009868 A | 1/2016 |
| WO | 2011-125156 A1 | 10/2011 |
| WO | 2013-100155 A1 | 7/2013 |
| WO | 2013-141221 A1 | 9/2013 |

* cited by examiner

SEMICONDUCTOR DEVICE AND MANUFACTURING METHOD OF SEMICONDUCTOR DEVICE

The contents of the following Japanese patent application(s) are incorporated herein by reference:
No. 2015-183143 filed in JP on Sep. 16, 2015, and
No. PCT/JP2016/073199 filed on Aug. 5, 2016.

BACKGROUND

1. Technical Field

The present invention relates to a semiconductor device and a manufacturing method of a semiconductor device.

2. Related Art

Conventionally, in a vertical semiconductor device which causes a current to flow in a thickness direction of a semiconductor substrate, the configuration has been known including a field stop layer provided at a side of a back surface of the semiconductor substrate (for example, refer to Patent Documents 1 and 2).

Patent Document 1: Japanese Patent Application Publication No. 2009-99705
Patent Document 2: International Publication No. 2013/100155

If the field stop layer is provided at a shallow position, it is difficult to sufficiently suppress turn off vibrations and reverse recovery vibrations of an IGBT and the like.

SUMMARY

In a first aspect of the present invention, provided is a semiconductor device including: a semiconductor substrate doped with an impurity; a front-surface-side electrode provided at a side of a front surface of the semiconductor substrate; and a back-surface-side electrode provided at a side of a back surface of the semiconductor substrate; wherein the semiconductor substrate includes: a peak region arranged at the side of the back surface of the semiconductor substrate and having one or more peaks of an impurity concentration; a high concentration region arranged closer to the front surface than the peak region and having an impurity concentration more gently sloped than the one or more peaks; and a low concentration region arranged closer to the front surface than the high concentration region and having an impurity concentration lower than the impurity concentration of the high concentration region and a substrate concentration of the semiconductor substrate.

The impurity concentration of the high concentration region may be equal to or higher than the substrate concentration of the semiconductor substrate. The impurity concentration of the high concentration region may be equal to the substrate concentration of the semiconductor substrate.

The semiconductor substrate may include a first region, a second region having a shorter carrier lifetime than the first region, and a transition region between the first region and the second region. The transition region may include a boundary between a P-type semiconductor layer and an N-type semiconductor layer of the semiconductor substrate.

The carrier lifetime of the first region may be 10 μs or more and the carrier lifetime of the second region may be 0.1 μs or less. A length of the transition region in a depth direction may be 5 μm or more. A length of the transition region in a depth direction may be longer than a half width of the peak closest to the back surface. A length of the transition region in a depth direction may be longer than a length of a P-type semiconductor layer of the semiconductor substrate in the depth direction.

The semiconductor substrate may be an MCZ substrate. An average oxygen concentration of the semiconductor substrate may be $1.0 \times 10^{16}/cm^3$ or more and $1.0 \times 10^{18}/cm^3$ or less. The semiconductor substrate may further include a defect region formed to extend in a depth direction from the front surface of the semiconductor substrate.

A part of the defect region and a part of the high concentration region may be formed at the same position in the depth direction. An end of the defect region may extend closer to the back surface of the semiconductor substrate than the peak provided closest to the front surface of the semiconductor substrate in the peak region. An end of the defect region may be formed at the same position in the depth direction as any of the peaks in the peak region.

The semiconductor substrate may further include a defect region formed to extend in a depth direction from the back surface of the semiconductor substrate.

The defect region may extend closer to the front surface of the semiconductor substrate than the high concentration region.

The semiconductor substrate may include a transistor region having a transistor formed therein and a diode region having a diode formed therein. The high concentration region may be formed in the diode region. The high concentration region may further be formed in the transistor region. The high concentration region may not be formed in the transistor region.

In a second aspect of the present invention, provided is a manufacturing method of a semiconductor device including doping a proton from a side of a back surface of a semiconductor substrate. The method may include: annealing the semiconductor substrate after the doping of the proton; and forming a defect region to extend in a depth direction of the semiconductor substrate after the annealing.

The method may include annealing the semiconductor substrate after the forming of the defect region.

In the forming of the defect region, the semiconductor substrate may be irradiated with an electron beam of 20 kGy or more and 1500 kGy or less. In the forming of the defect region, the defect region may be formed to extend from the front surface or the back surface of the semiconductor substrate to an implanting position of a defect generating substance, by implanting the defect generating substance from the front surface or the back surface of the semiconductor substrate to a predetermined depth of the semiconductor substrate.

The semiconductor substrate may include a transistor region having a transistor formed therein and a diode region having a diode formed therein. In the forming of the defect region, at least part of the transistor region may be masked to implant the defect generating substance.

In a third aspect of the present invention, provided is a manufacturing method of a semiconductor device including doping a proton from a side of a back surface of a semiconductor substrate. The method may include forming a defect region to extend in a depth direction of the semiconductor substrate. The method may include, after the forming of the defect region and the doping of the protons, performing lifetime annealing and proton annealing, indiscretely.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the claimed invention. Also, all of combinations of features described in the embodiments are not necessarily required for a means for solving problems of the invention.

Figure 1A:
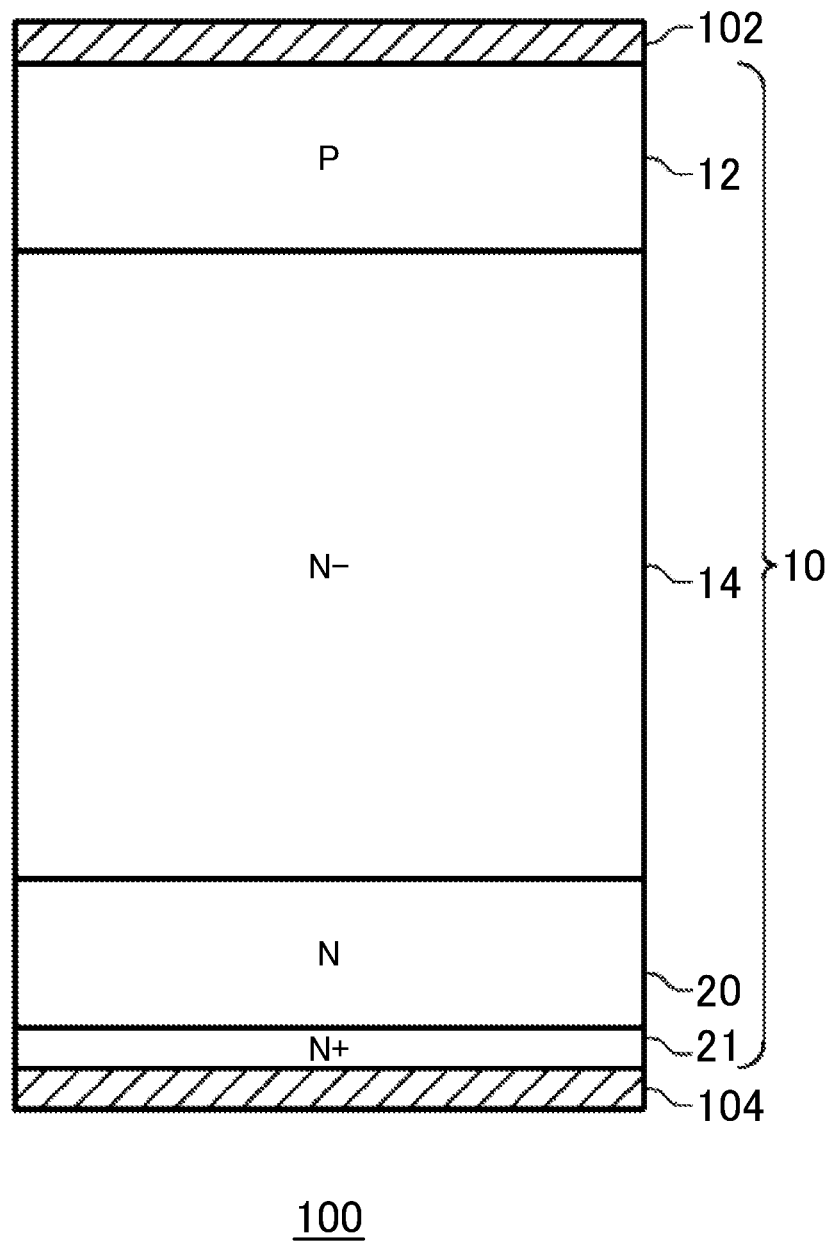
FIG. 1A is a schematic cross-sectional view illustrating a semiconductor device 100 according to a first embodiment of the present invention.

FIG. 1A is a schematic cross-sectional view illustrating a semiconductor device 100 according to a first embodiment of the present invention. The semiconductor device 100 is a vertical semiconductor device which includes electrodes formed on a front surface and a back surface of a semiconductor substrate 10 and causes a current to flow in a thickness direction of the semiconductor substrate 10. In the present example, a free wheel diode (FWD) is illustrated as one example of the semiconductor device 100.

The semiconductor device 100 includes the semiconductor substrate 10, a front-surface-side electrode 102 and a back-surface-side electrode 104. The semiconductor substrate 10 is formed of semiconductor material such as silicon or a compound semiconductor. The semiconductor substrate 10 is doped with impurities of a predetermined concentration. The semiconductor substrate 10 of the present example has a conductivity type of an N--type.

The semiconductor substrate 10 includes the front-surface-side region 12, a drift region 14, a field stop region (FS region 20) and a cathode region 21. The drift region 14 has the same conductivity type as that of the semiconductor substrate 10. In the present example, the drift region 14 is of the N--type. The front-surface-side region 12 is formed at a side of the front surface of the semiconductor substrate 10 and is doped with impurities of a conductivity type different from that of the drift region 14. In the present example, the front-surface-side region 12 is of a P-type. If the semiconductor device 100 is the FWD, the front-surface-side region 12 functions as an anode region.

The FS region 20 is formed at a side of the back surface of the semiconductor substrate 10. The FS region 20 has the same conductivity type as that of the drift region 14 and is doped with impurities to have a higher concentration than the drift region 14. In the present example, the FS region 20 is of an N-type. The cathode region 21 is formed between the FS region 20 and the back-surface-side electrode 104. The cathode region 21 is one example of a back-surface-side region formed between the FS region 20 and the back-surface-side electrode 104. By providing the FS region 20 of a high concentration, a depletion layer extending from a boundary surface between the front-surface-side region 12 and the drift region 14 can be prevented from reaching the back-surface-side region of the semiconductor substrate 10.

The front-surface-side electrode 102 is provided at the side of the front surface of the semiconductor substrate 10. The front-surface-side electrode 102 of the present example has a planar shape, while the front-surface-side electrode 102 in another example may also have a trench shape. If the semiconductor device 100 is the FWD, the front-surface-side electrode 102 is an anode electrode.

The back-surface-side electrode 104 is provided at the side of the back surface of the semiconductor substrate 10. If the semiconductor device is the FWD, the back-surface-side electrode 104 is a cathode electrode.

Figure 1B:
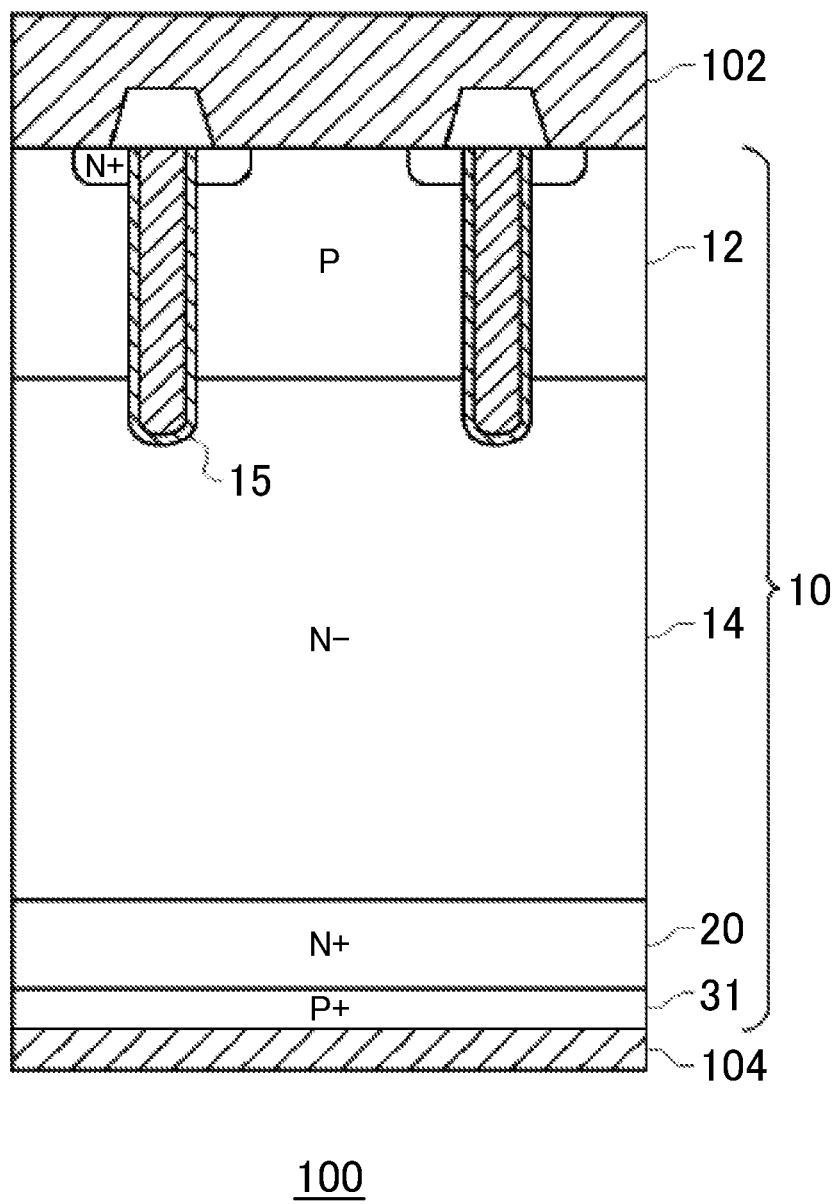
FIG. 1B is a schematic cross-sectional view illustrating the semiconductor device 100 according to the first embodiment of the present invention.

FIG. 1B is a schematic cross-sectional view illustrating the semiconductor device 100 according to the first embodiment of the present invention. In the present example, an insulated gate bipolar transistor (IGBT: Insulated Gate Bipolar Transistor) is illustrated as one example of the semiconductor device 100. In the present example, the same configuration as the configuration illustrated in FIG. 1A is illustrated with the same label, unless otherwise specified.

The semiconductor substrate 10 of the present example includes the front-surface-side region 12, the drift region 14, the FS region 20 and a collector region 31. The semiconductor substrate 10 of the present example includes a gate section 15 formed at the side of the front surface. The gate section 15 controls ON/OFF of currents between the front-surface-side electrode 102 and the back-surface-side electrode 104. If the semiconductor device 100 is the IGBT, the front-surface-side region 12 functions as an emitter region.

The collector region 31 is a back-surface-side region between the FS region 20 and the back-surface-side electrode 104. The collector region 31 has a different conductivity type from that of the semiconductor substrate 10. The collector region 31 of the present example has a conductivity type of a P+-type. Note that if the semiconductor device 100 is the IGBT, the front-surface-side electrode 102 is an emitter electrode and the back-surface-side electrode 104 is a collector electrode.

Figure 2A:
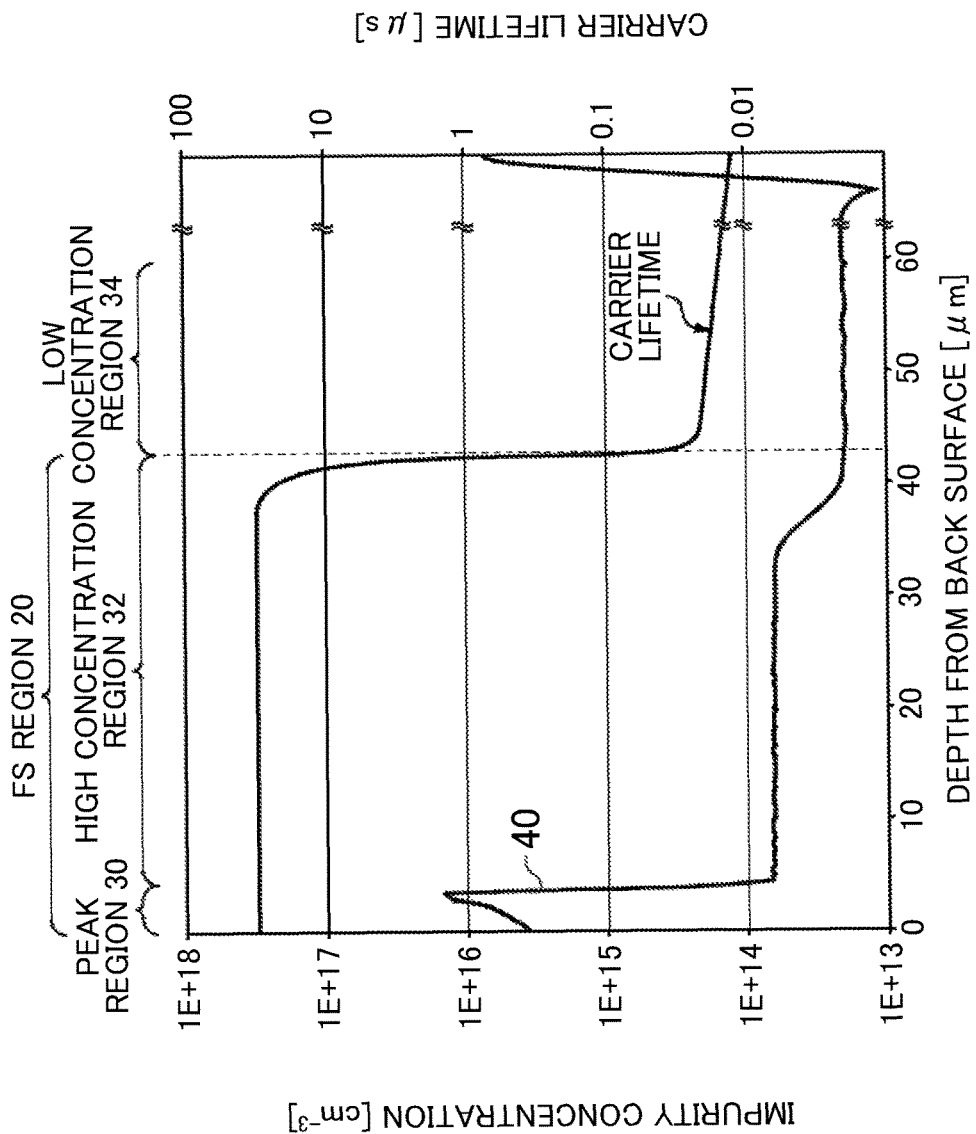
FIG. 2A illustrates an example of distributions of the impurity concentration and the carrier lifetime in a part of the FS region 20 and the drift region 14.

FIG. 2A illustrates an example of distributions of the impurity concentration and the carrier lifetime in a part of the FS region 20 and the drift region 14. In FIG. 2A, the horizontal axis indicates a depth from the back surface of the semiconductor substrate 10 and the vertical axis indicates the impurity concentration. Also, the carrier lifetime indicates a relative value that is not to the scale of the vertical axis.

The FS region 20 includes a peak region 30 and a high concentration region 32, in order from the proximity of the back surface. Also, the drift region 14 includes a low concentration region 34 having a lower impurity concentration than that of the high concentration region 32. The entire drift region 14 may be the low concentration region 34. The peak region 30 is arranged, for example, closer to the back surface than the center of the semiconductor substrate 10. The peak region 30 may be formed in a predetermined range within 30 μm, may be formed in a predetermined range within 20 μm, or may be formed in a predetermined range within 10 μm from the back surface of the semiconductor substrate 10.

The impurity concentration distribution in the peak region 30 has one or more peaks 40. The peaks 40 are formed by doping small-mass impurities such as protons, from the side of the back surface of the semiconductor substrate 10. By using lightweight impurities such as protons, the position of the peaks 40 can be controlled with a high accuracy. The impurities is preferably substance having a smaller mass than phosphorous and selenium.

The high concentration region 32 is arranged closer to the front surface than the peak region 30. The impurity concentration of the high concentration region 32 is higher than the impurity concentration of the semiconductor substrate 10 (the impurity concentration of the drift region 14 in the present example) and is varied more gently in the depth direction of the semiconductor substrate 10 than that of the peak region 30 (the peaks 40 in the present example). The maximum value of the impurity concentrations of the high concentration region 32 may be 1.2 times or more, may be 1.5 times or more, or may be twice or more the impurity concentration of the low concentration region 34. Also, an average value of the impurity concentrations of the high concentration region 32 may also be 1.1 times or more, or may also be 1.2 times or more the impurity concentration of the low concentration region 34. The impurity concentration of the low concentration region 34 described above may be the average impurity concentration of the low concentration region 34.

Also, the maximum value of slopes of the impurity concentration distribution in the high concentration region 32 against the depth may be smaller than an average value of slopes of the impurity concentration distribution in the peaks 40. Also, the maximum value of the impurity concentrations of the high concentration region 32 is smaller than the maximum values of the respective peaks 40 included in the peak region 30. Also, the maximum value of the impurity concentrations of the high concentration region 32 may also be smaller than the minimum value of the impurity concentrations of the peak region 30.

Also, the high concentration region 32 may be longer in the depth direction than one peak 40. Also, the high concentration region 32 may also be longer in the depth direction than the entire peak region 30. Note that a boundary between the high concentration region 32 and the peak region 30 may be a point at which the impurity concentration first indicates a local minimum value after the peak 40 closest to the back surface. Also, the boundary between the high concentration region 32 and the peak region 30 may be a point at which an amount of change in impurity concentration in the depth direction reaches a predetermined value or less after the peak 40 closest to the back surface. For example, at a side closer to the front surface than the peak 40, a point at which a change in impurity concentration reaches 20% or less with respect to a distance of 1 μm in the depth direction may also be set as the boundary of the high concentration region 32 at the side of the back surface. Also, the boundary between the high concentration region 32 and the low concentration region 34 may be a point at which the impurity concentration reaches an average impurity concentration of the drift region 14.

Note that if the peak region 30 includes a plurality of peaks 40, the high concentration region 32 is longer than a width of any of the peaks 40. The width of the peak 40 refers to a width between two local minimum values of the impurity concentrations. Also, if the peak region 30 includes a plurality of peaks 40, the high concentration region 32 may also be longer than the entire peak region 30.

The low concentration region 34 is arranged closer to the front surface than the high concentration region 32. The impurity concentration of the low concentration region 34 is lower than the impurity concentration of the high concentration region 32. Also, the impurity concentration of the low concentration region 34 is lower than the substrate concentration of the semiconductor substrate 10. This allows mobility of the low concentration region 34 to be locally decreased, thereby speeding up operations of the semiconductor device 100. Here, the substrate concentration of the semiconductor substrate 10 refers to an impurity concentration in an initial state in which the semiconductor substrate 10 is not yet irradiated with electron beams or implanted with protons. For example, if the semiconductor substrate 10 is silicon of a P-type, the substrate concentration of the semiconductor substrate 10 is an impurity concentration obtained by doping boron, phosphorous, arsenic or the like.

The high concentration region 32 is formed, after or before doping impurities such as protons under predetermined conditions to generate the peaks 40, by forming the defect region which extends in the depth direction of the semiconductor substrate 10 and performing a thermal processing after doping protons and forming the defect region. The defect region has crystal defects of a higher density than the other regions of the semiconductor substrate 10. The defect region is formed in at least part of a region in which the high concentration region 32 is to be formed. The defect region may be formed in the same region as the region in which the high concentration region 32 is to be formed, or may be formed in a region wider than the region in which the high concentration region 32 is to be formed. In the defect region, relatively many crystal defects exist, which facilitates impurities such as protons to be diffused to a deep position.

As one example, the defect region can be formed by irradiating the semiconductor substrate 10 with electron beams under predetermined conditions. By irradiating the semiconductor substrate 10 with electron beams under predetermined conditions, crystal defects are formed in a region closer to the front surface than the peak region 30. An irradiation amount of electron beams is preferably 1500 kGy or less. Also, the irradiation amount of electron beams may be 1200 kGy or less, or may be 800 kGy or less. However, for controlling the carrier lifetime, the irradiation amount of electron beams is preferably 20 kGy or more. The irradiation amount of electron beams may also be adjusted in accordance with an accelerating voltage of protons.

Then, by performing the thermal processing on the semiconductor substrate 10, impurities such as protons doped in the peak region 30 are diffused toward the side of the front surface. Such a process results in the high concentration region 32 formed to be more gently sloped than the peak region 30. Accordingly, it can suppress dv/dt and a surge voltage during reverse recovery. This can make wave forms of the voltage and the current during switching smooth.

The impurity concentration of the high concentration region 32 may be equal to or higher than the substrate concentration of the semiconductor substrate 10 due to diffusion of protons. Also, the impurity concentration of the high concentration region 32 may also be recovered to be equal to the substrate concentration of the semiconductor substrate 10. In this case, the impurity concentrations of the high concentration region 32 are not necessarily equal to the substrate concentration in the entire high concentration region 32, and an average impurity concentration of the high concentration region 32 may be equal to the substrate concentration.

A length of the high concentration region 32 in the depth direction may be 5 µm or more. The length of the high concentration region 32 refers to a length from the boundary with the peak region 30 to the boundary with the low concentration region 34. Also, the length of the high concentration region 32 may be 10 µm or more, may be 20 µm or more, or may be 30 µm or more. The length of the high concentration region 32 can be controlled in accordance with a doping amount of impurities such as protons, a range within which the defect region is formed, a density of crystal defects in the defect region and the like. If the defect region is formed by irradiating with electron beams, the length of the high concentration region 32 can be controlled in accordance with an irradiation amount of electron beams, a temperature or time period of the thermal processing after electron beam irradiation and the like.

Also, because diffusion of impurities such as protons recovers crystal defects formed in the defect region by electron beams and the like, the carrier lifetime can be shorter at the side of the front surface of the semiconductor substrate and the carrier lifetime at the side of the back surface can be longer. Specifically, implantation of protons allows hydrogen to be introduced into a range region of the semiconductor substrate 10. The thermal processing allows the introduced hydrogen to be further diffused from the range region to a back side of the semiconductor substrate 10 (in this case, the side of the front surface). Hydrogen introduced in this manner can terminally bond dangling bonds due to point defects formed by electron beam irradiation and the like. This decreases the point defect concentration and increases the carrier lifetime. Therefore, peak currents Irp and dv/dt during reverse recovery can be decreased at the same time.

The semiconductor substrate 10 includes a first region having a long carrier lifetime and a second region having a carrier lifetime shorter than that of the first region. In the present example, the carrier lifetime of the first region is 10 µs or more and the carrier lifetime of the second region is 0.1 µs or less. Also, in the present description, between the first region and the second region, a region in which the carrier lifetime is decreased from the side of the back surface to the side of the front surface is referred to as a transition region. Note that a length of the transition region in the depth direction may be 1 µm or more, may be 3 µm or more, or may be 5 µm or more.

In the present example, the first region corresponds to the high concentration region 32 and the second region corresponds to the low concentration region 34. Also, the carrier lifetime in the high concentration region 32 is substantially constant, and the carrier lifetime in the low concentration region 34 is gradually decreased toward the side of the front surface. However, by increasing the doping amount of protons, the first region may extend close to the front surface. For example, the first region may extend close to the front surface to the extent that the transition region includes the boundary between the P-type semiconductor layer and the N-type semiconductor layer of the semiconductor substrate 10 (that is, the boundary between the front-surface-side region 12 and the drift region 14).

Note that the configuration in which the transition region includes the boundary between the P-type semiconductor layer and the N-type semiconductor layer of the semiconductor substrate 10 is also achieved by forming the semiconductor substrate 10 to have a smaller thickness. Also, the length of the transition region in a depth direction may be longer than a half width of the peak 40 closest to the back surface. Here, the half width of the peak 40 may be a half width of the side of the back surface or the side of the front surface, with respect to the center of the peaks 40. For example, the half width of the peak 40 is around 2 µm in case of protons. Further, the length of the transition region in the depth direction may also be longer than the length of the front-surface-side region 12 in the depth direction.

The peak region 30 and the high concentration region 32 are considered to be regions which include a donor of vacancy-oxygen-hydrogen defects (VOH defect) formed therein, including: vacancies (V) introduced by implantation of protons, electron beam irradiation or the like; oxygen (O) mixed therein during preparation of the semiconductor substrate 10 or introduced during an element forming process; and implanted hydrogen (H). The donor formed of VOH defects has a donor transformation rate indicating a rate of transformation to a donor within a range of 0.1% to 10% with respect to an implantation amount of introduced hydrogen or a concentration of hydrogen.

In the peak region 30, a concentration distribution resulting from the hydrogen concentration distribution multiplied by the donor transformation rate is sufficiently higher than a phosphorous concentration of the semiconductor substrate 10. Therefore, a donor concentration distribution (net doping concentration distribution) of VOH defects which reflects the concentration distribution of implanted hydrogen is indicated. In other words, the donor concentration distribution in the peak region 30 may correspond to a concentration lower than the donor concentration of the semiconductor substrate 10 (for example, a phosphorous concentration) by the concentration distribution of implanted hydrogen multiplied by a predetermined donor transformation rate, and is a similar pattern to the concentration distribution of hydrogen.

On the other hand, the high concentration region 32 is a region deeper than the range Rp of implanted protons, and thus is a region at a back side of the semiconductor substrate 10 (in this case, the side of the front surface) to which hydrogen is diffused from the range Rp. In this case, a value resulting from the diffused hydrogen concentration distribution multiplied by the donor transformation rate is smaller than the phosphorous concentration of the semiconductor substrate 10. On the other hand, electron beam irradiation and the like makes the point defect concentration distributed almost uniformly in a predetermined region deeper than the range Rp of protons. Therefore, the diffused hydrogen atoms are attached to vacancies and oxygen to form a VOH defect complex. If the donor concentration as this VOH defect exceeds the phosphorous concentration of the semiconductor substrate 10, the high concentration region 32 can be formed. At this time, as oxygen and a small amount of diffused hydrogen are attached to a substantially uniform vacancy concentration distribution, the concentration distribution of VOH defect complexes also become substantially uniform. That is, the donor concentration distribution of the high concentration region 32 is dominated by the concentration distribution of vacancies in a state of introduction by electron beam irradiation and the like. Note that because vacancies are attached to oxygen, hydrogen, and atoms of the semiconductor (such as silicon) when VOH defect complexes are formed, and replaced with VOH defects, a considerable number of vacancies as such are considered to disappear compared to the introduced number. Therefore, it may be considered that the donor concentration distribution of the high concentration region 32 is higher than the concentration of the donor (such as phosphorous) of the semiconductor substrate, and substantially uniform.

Figure 2B:
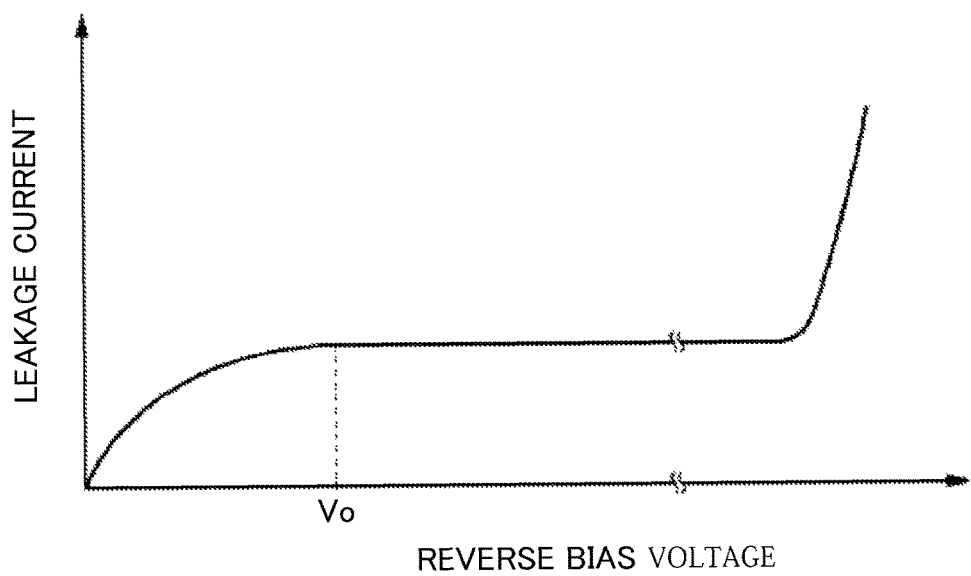
FIG. 2B illustrates a measurement method of the carrier lifetime in the semiconductor device 100.

FIG. 2B is a diagram illustrating a measurement method of the carrier lifetime in the semiconductor device 100. In the present example, the defect region is formed by electron beam irradiation. FIG. 2B illustrates the relationship between a reverse bias voltage and a leakage current of the semiconductor device 100. In the low concentration region 34, crystal defects are formed by electron beam irradiation. Also, defects have not disappeared even by impurities such as protons. Therefore, when the reverse bias is increased from 0 V, the leakage current is gradually increased.

On the other hand, in the high concentration region 32, diffusion of impurities such as protons allows dangling bonds of defects to be terminally attached to hydrogen, thereby decreasing crystal defects compared to those in the low concentration region 34. Therefore, even if the reverse bias is increased to exceed a predetermined voltage Vo which corresponds to the boundary position between the low concentration region 34 and the high concentration region 32, the leakage current is not increased. However, if a very large reverse bias is applied, avalanche breakdown causes a rapid increase in the leakage current.

As described above, by measuring the reverse bias voltage Vo at which the leakage current becomes unchanged, the boundary position between the high concentration region 32 and the low concentration region 34 can be estimated. Note that the relationship between the voltage Vo and the boundary position $x_0$ is predetermined by the following formula.

$$x_0 = \sqrt{\frac{2\varepsilon_r \varepsilon_0 V_0}{qN_D}} \quad \text{[Expression 1]}$$

Example 1

Figure 3:
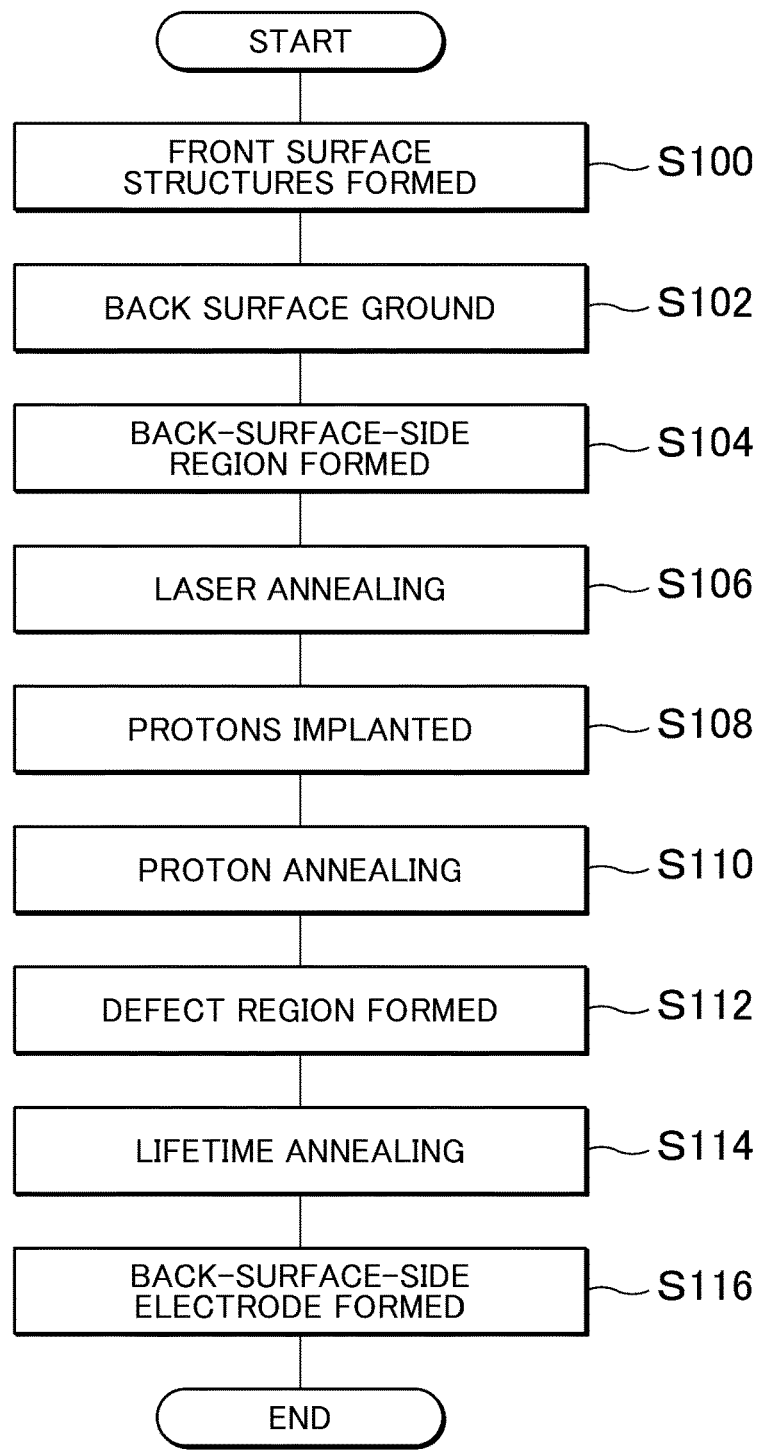
FIG. 3 illustrates one example of a manufacturing method of the semiconductor device 100 according to Example 1.

FIG. 3 illustrates one example of a manufacturing method of the semiconductor device 100 according to Example 1. First, a base substrate is prepared, and front surface structures such as the front-surface-side region 12 and the front-surface-side electrode 102 are formed at the side of the front surface of the base substrate (S100). Next, the semiconductor substrate 10 is formed to have a substrate thickness in accordance with a breakdown voltage by grinding the back surface of the base substrate (S102).

Next, the back-surface-side region is formed by doping impurities such as phosphorous from the side of the back surface of the semiconductor substrate 10 to a shallow position (S104). After doping impurities, the back-surface-side region is annealed by a laser and the like (S106).

Next, protons are doped from the side of the back surface of the semiconductor substrate 10 to a position deeper than that of the back-surface-side region (S108). In S108, protons may be doped at one or more depth positions. After doping protons, proton annealing is performed on the semiconductor substrate 10 under predetermined conditions (S110). This allows the peak region 30 including one or more peaks 40 to be formed.

Next, the semiconductor substrate 10 is irradiated with electron beams (S112). The semiconductor substrate 10 may be irradiated with electron beams from the side of the back surface or from the side of the front surface. After irradiating with electron beams, the semiconductor substrate 10 is annealed under predetermined conditions (S114). This allows the high concentration region 32 to be formed.

Then, the back-surface-side electrode 104 is formed at the side of the back surface of the semiconductor substrate 10 (S116). This allows the semiconductor device 100 to be manufactured. Note that a step of forming a floating region may further be included between S104 and S106. In the step, a predetermined mask pattern may be formed on the back surface of the semiconductor substrate 10 to dope impurities such as boron in a region which is not covered by the mask pattern.

Also, a step of doping helium from the side of the back surface of the semiconductor substrate 10 may also be included between S110 and S112. In the step, helium is doped at a predetermined depth position in the peak region 30 to adjust the carrier lifetime.

Such a method allows the high concentration region 32 to be formed to a deep position of the semiconductor substrate 10. Also, the high concentration region 32 can be formed to have a relatively uniform concentration. It may be considered that an impurity region of a high concentration is formed at a deep position of the semiconductor substrate 10 by accelerating small-mass impurities such as protons at a high voltage. In this case, however, an expensive apparatus is required. To the contrary, the manufacturing method of the present example can be achieved by a simple apparatus because it just needs to dope protons at a relatively shallow position.

In the foregoing examples, the defect region was formed by irradiating the semiconductor substrate 10 with electron beams. However, the defect region may also be formed by a method other than electron beam irradiation. For example, the semiconductor substrate 10 may be implanted with a defect generating substance to form the defect region. The defect generating substance is a substance which can generate crystal defects in a region of the semiconductor substrate 10 through which the substance passes. As one example, the defect generating substance is helium.

Also, in the foregoing examples, helium was doped from the side of the back surface of the semiconductor substrate 10, where helium was implanted from the back surface of the semiconductor substrate 10 within a range even shallower than a range of protons implanted at the shallowest peak position from the back surface of the semiconductor substrate 10. On the other hand, helium ions may also be implanted even deeper than the range of protons implanted at the deepest peak position from the back surface of the semiconductor substrate 10. Crystal defects are formed in the region through which helium ions implanted from the back surface of the semiconductor substrate 10 pass. Therefore, the defect region can be formed to extend from the back surface of the semiconductor substrate 10.

Figure 4:
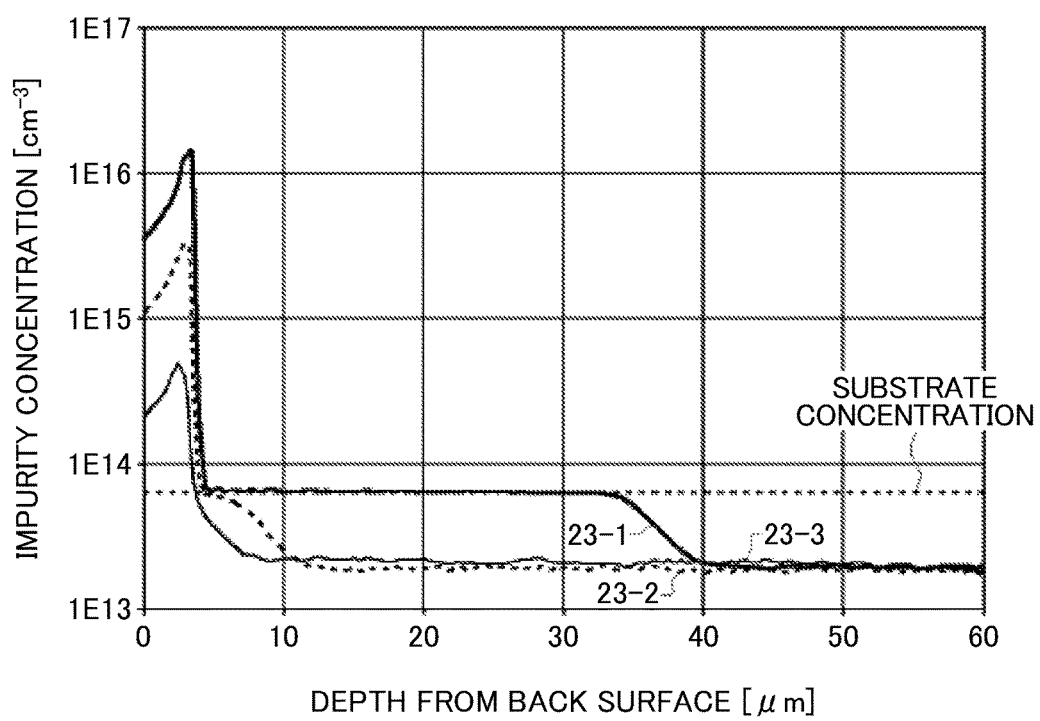
FIG. 4 illustrates an example of the impurity concentration distributions with a doping amount of protons varied.

FIG. 4 illustrates another example of the impurity concentration distributions with a doping amount of protons varied. In the present example, protons were used as impurities for doping the peak region 30, and electron beam irradiation was used for forming the defect region. Also, in the present example, the impurity concentration distributions of protons for each of three doping amounts 23-1, 23-2 and 23-3 are illustrated.

In each example of distributions, an accelerating voltage for accelerating protons was set to 550 keV, an annealing temperature after doping protons was set to 370 degrees C., an annealing time was set to five hours, an irradiation amount of electron beams was set to 800 kGy, an annealing temperature after electron beam irradiation was set to 360 degrees C., and an annealing time was set to one hour. Also, the doping amounts of protons are $1.0 \times 10^{15}/cm^2$ for the distribution 23-1, $1.0 \times 10^{14}/cm^2$ for the distribution 23-2, and $1.0 \times 10^{13}/cm^2$ for the distribution 23-3.

As shown in FIG. 4, it could be understood that the larger the doping amount of protons is, the longer the high concentration region 32 extends at a side closer to the front surface than the peak region 30. Note that almost no high concentration region 32 can be seen for the distribution 23-3 with a relatively small doping amount of protons of $1.0 \times 10^{13}/cm^2$. Therefore, the doping amount of protons is preferably set to $1.0 \times 10^{14}/cm^2$ or more.

Also, as can be understood from the distribution 23-1 and the distribution 23-2, if the doping amount of protons is varied from $1.0 \times 10^{14}/cm^2$ to $1.0 \times 10^{15}/cm^2$, the high concentration region 32 is spread efficiently. Therefore, the doping amount of protons may be larger than $1.0 \times 10^{14}/cm^2$ or may be $1.0 \times 10^{15}/cm^2$ or more. For example, if the doping amount of protons is $1.0 \times 10^{15}/cm^2$ or more, the mobility recovers within a region up to 30 μm deeper than the range Rp of protons. Note that for any of distributions 23-1, 23-2, and 23-3, the impurity concentration of the low concentration region 34 is lower than the substrate concentration of the semiconductor substrate 10. Also, the high concentration region 32 for the distribution 23-1 is equal to the substrate concentration.

Figure 5:
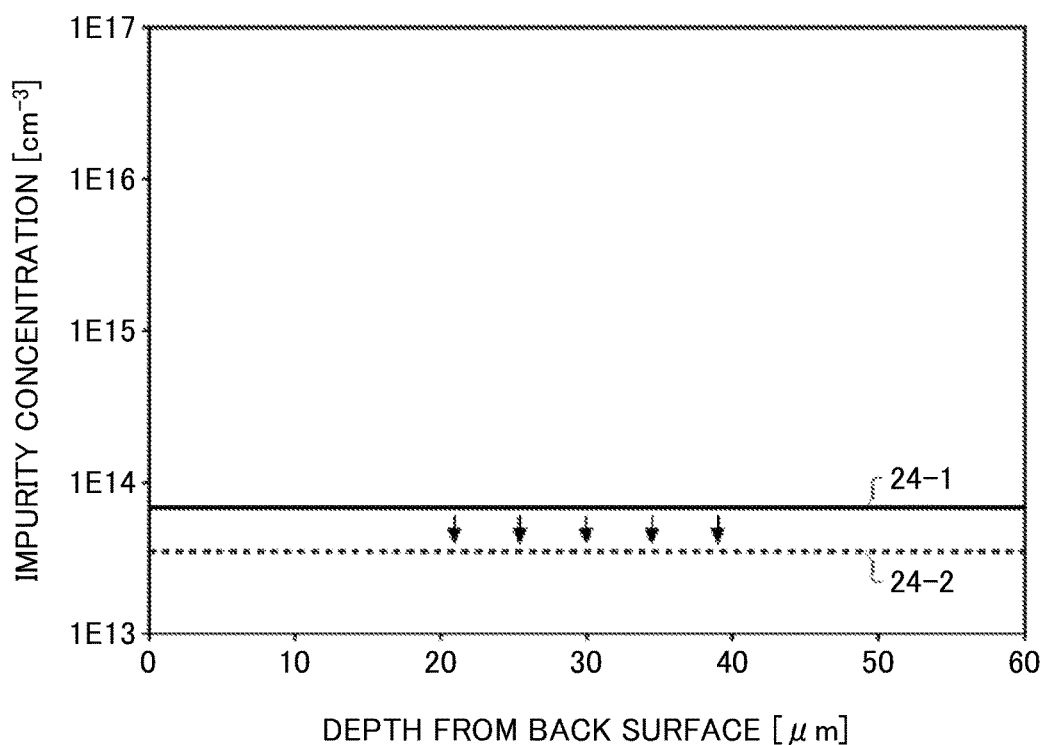
FIG. 5 compares the impurity concentration distributions, one with an electron beam irradiation and the other without an electron beam irradiation.

FIG. 5 compares the impurity concentration distributions, one with an electron beam irradiation and the other without an electron beam irradiation. In the present example, an impurity concentration distribution 24-1 for the semiconductor substrate 10 having a uniform impurity concentration and not irradiated with electron beams, and an impurity concentration distribution 24-2 for the semiconductor substrate 10 irradiated with electron beams are illustrated.

As shown in FIG. 5, by irradiating the semiconductor substrate 10 with electron beams, the impurity concentration of the semiconductor substrate 10 is decreased. That is, FIG. 5 illustrates that electron beam irradiation results in a decrease in the mobility of the semiconductor substrate 10. The concentration distributions in the specification were measured by the well-known Spread resistance Profiling (hereinafter referred to as SR profiling).

In the SR profiling, a resistivity (resistance ratio) is calculated from a spread resistance, and a carrier concentration is further calculated by using an elementary charge and a mobility of carriers. The mobility of carriers at this moment is represented by using a value in a crystal state. Therefore, if crystal defects (lattice defects) are introduced due to electron beam irradiation, helium irradiation or the like, scattering of carriers and the like result in a decrease in the mobility. Thus, the calculated carrier concentration is a concentration lower than an actual carrier concentration (donor concentration) by a decreased amount of the mobility. Note that the larger the irradiation amount of electron beam is, the lower the mobility becomes, thereby also decreasing the carrier concentration. The irradiation amount of electron beams of several hundreds kGy largely decreases the mobility of the semiconductor substrate 10. Particularly, with the irradiation amount of 800 kGy or 1000 kGy or more, the mobility of the semiconductor substrate 10 is significantly decreased. In this manner, the mobility can be adjusted by varying the irradiation amount of electron beams.

Figure 6:
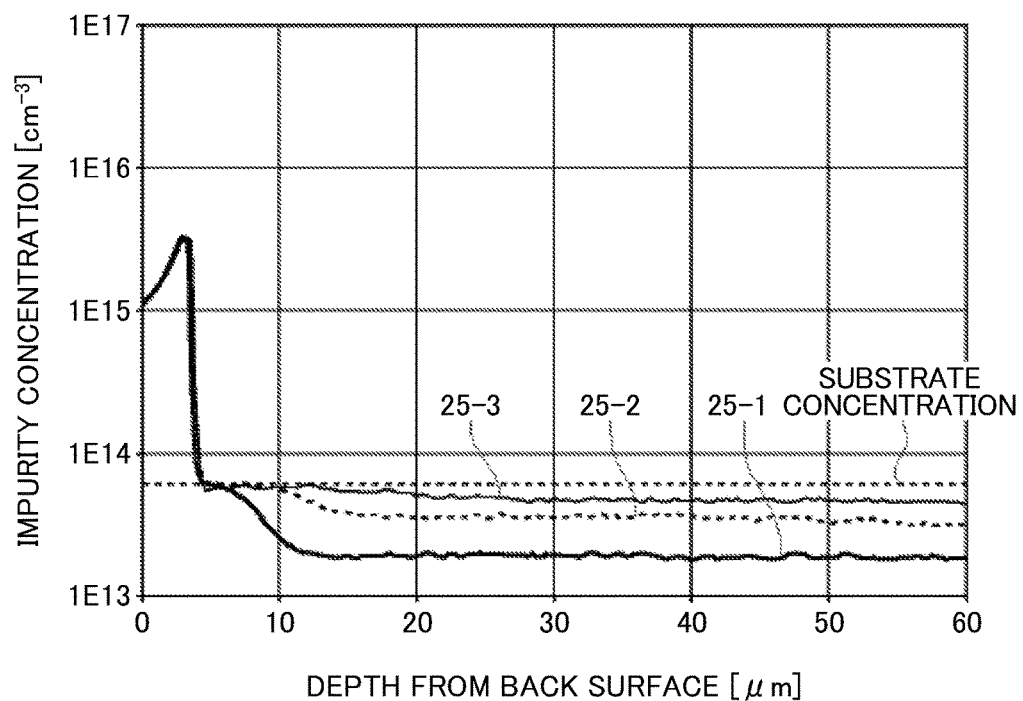
FIG. 6 illustrates an example of the impurity concentration distribution with conditions of the electron beam irradiation changed.

FIG. 6 illustrates an example of the impurity concentration distribution with conditions of the electron beam irradiation changed. In the present example, the impurity concentration distributions 25-1, 25-2 and 25-3 are illustrated under three conditions of the electron beam irradiations, respectively.

In each example of the distributions, an accelerating voltage for accelerating protons was set to 550 keV, a doping amount of protons was set to $1.0 \times 10^{14}/cm^2$, an annealing temperature after doping protons was set to 370 degrees C., an annealing time was set to five hours, an annealing temperature after electron beam irradiation was set to 360 degrees C., and an annealing time was set to one hour. Also, the irradiation amounts of electron beams are 800 kGy for the distribution 25-1, 400 kGy for the distribution 25-2, and 160 kGy for the distribution 25-3.

As shown in FIG. 6, the larger the irradiation amount of electron beams is, the larger a decrease in the impurity concentration is. In other words, the larger the irradiation amount of electron beams is, the larger a decrease in the mobility (that is, the carrier concentration) is. This decrease in the mobility due to electron beam irradiation can be recovered by doping of protons, as shown in FIG. 4.

Example 2

Figure 7:
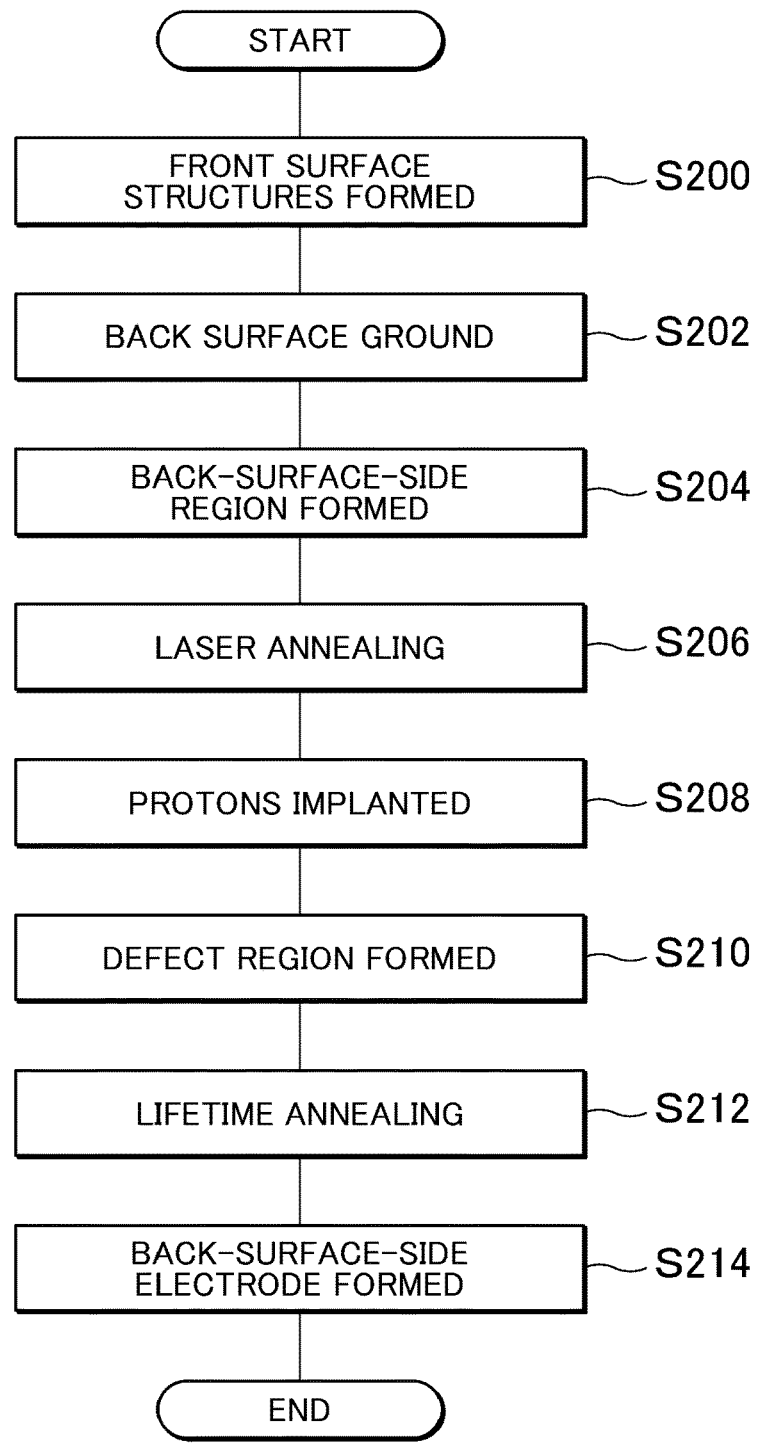
FIG. 7 illustrates one example of a manufacturing method of the semiconductor device 100 according to Example 2.

FIG. 7 illustrates one example of a manufacturing method of the semiconductor device 100 according to Example 2. In the present example, lifetime annealing also serves as proton annealing. The steps to a proton implantation step in S208 may be the same as S100 to S108 according to Example 1.

In the present example, following the proton implantation step in S208, the semiconductor substrate 10 is irradiated with electron beams (S210). The semiconductor substrate 10 may be irradiated with electron beams from the side of the back surface or from the side of the front surface. After irradiating with electron beams, the semiconductor substrate 10 is annealed under predetermined conditions (S212). This allows the high concentration region 32 to be formed. In annealing of the present example, proton annealing and lifetime annealing are performed indiscretely, thereby saving one annealing step compared to the manufacturing steps according to Example 1.

Figure 8:
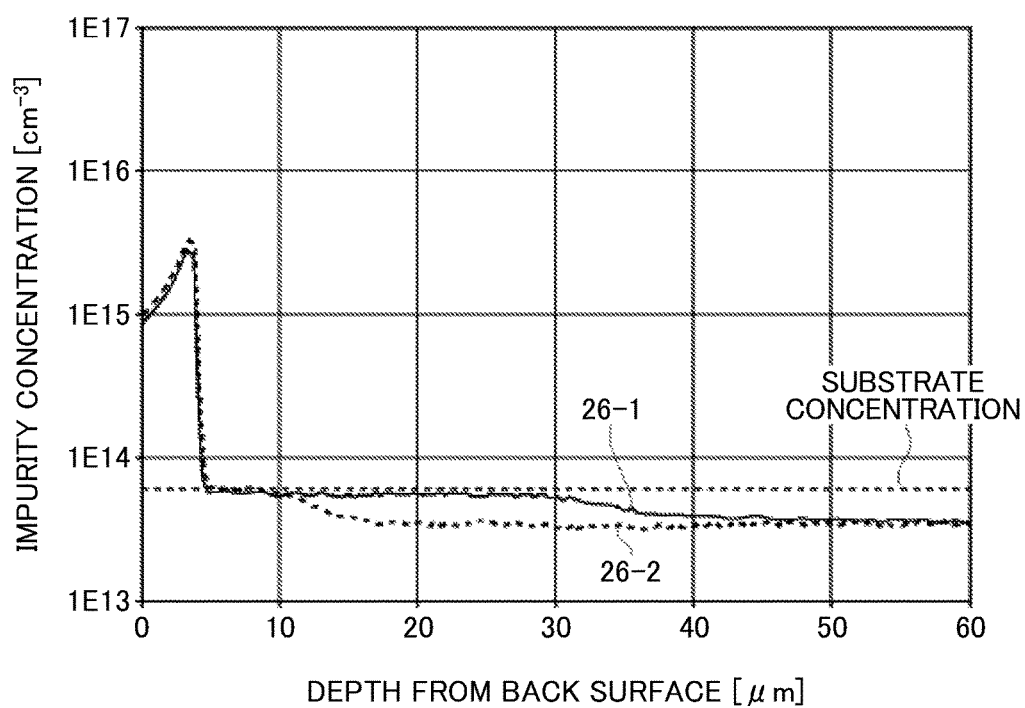
FIG. 8 illustrates an example of the impurity concentration distributions with annealing conditions changed in Example 2.

FIG. 8 illustrates an example of the impurity concentration distributions with annealing conditions changed in Example 2. In the present example, an accelerating voltage for accelerating protons was set to 550 keV and an irradiation amount of electron beams was set to 400 kGy. Also, annealing conditions after irradiation of protons and electron beams were set as follows: an annealing temperature was 370 degrees C. and an annealing time was five hours for the distribution 26-1; and an annealing temperature was 360 degrees C. and an annealing time was one hour for the distribution 26-2.

As shown in FIG. 8, the impurity concentration is increased by annealing under conditions of a high temperature and a long time. That is, the mobility (that is, the carrier concentration) is increased by annealing under conditions of a high temperature and a long time. For example, for the distribution 26-1, the high concentration region 32 can be formed in the semiconductor substrate 10 to a deeper position than for the distribution 26-2. Also, by annealing under conditions of a high temperature and a long time, the high concentration region 32 can be formed to have a relatively uniform concentration.

Example 3

Figure 9:
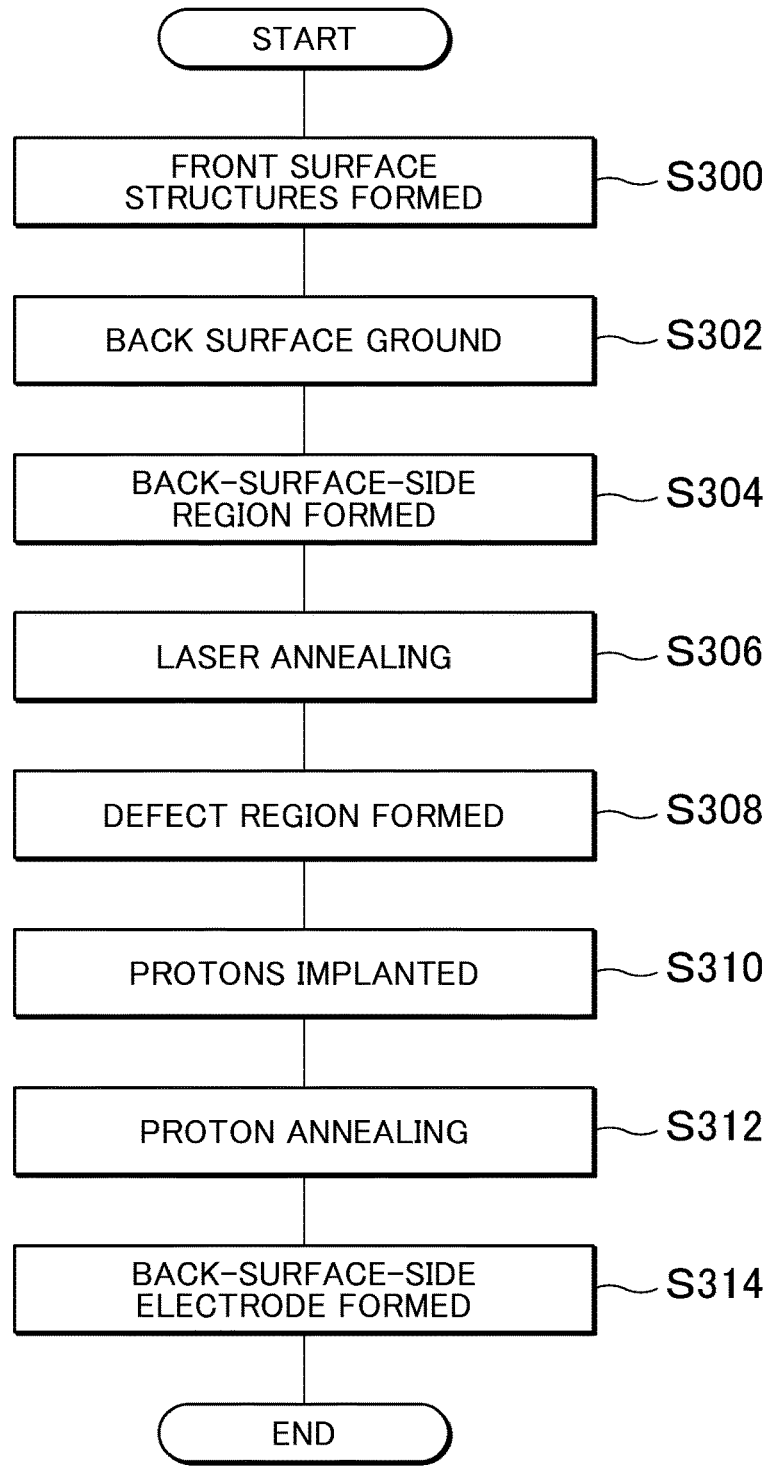
FIG. 9 illustrates one example of a manufacturing method of the semiconductor device 100 according to Example 3.

FIG. 9 illustrates one example of a manufacturing method of the semiconductor device 100 according to Example 3. In the present example, proton annealing also serves as lifetime annealing. The steps to a laser annealing step in S306 may be the same as S100 to S106 according to Example 1.

In the present example, following the laser annealing step in S306, the defect region is formed in the semiconductor substrate 10 to extend in the depth direction (S308). In S308, as described above, the defect region may be formed by irradiating electron beams. In this case, the defect region is formed to extend in the entire depth direction of the semiconductor substrate 10. The semiconductor substrate 10 may be irradiated with electron beams from the side of the back surface or from the side of the front surface. Next, protons are doped from the side of the back surface of the semiconductor substrate 10 to a position deeper than that of the back-surface-side region (S310). In S310, protons may be doped at one or more depth positions. After doping protons, the semiconductor substrate 10 is annealed under predetermined conditions (S312). This allows the high concentration region 32 to be formed. Annealing of the present example serves as both of proton annealing and lifetime annealing, thereby saving one annealing step compared to the manufacturing steps according to Example 1.

The impurity concentration distribution of the semiconductor device 100 formed according to the present example can be adjusted, similar to the impurity concentration distribution of Example 2, by changing conditions of annealing. For example, the impurity concentration is increased, particularly in a region of the high concentration region 32 which is closer to the front surface, by annealing under conditions of a high temperature and a long time. Also, the mobility (that is, the carrier concentration) recovers by annealing under conditions of a high temperature and a long time. This allows the high concentration region 32 to be formed in the semiconductor substrate 10 to a deep position.

Example 4

Figure 10:
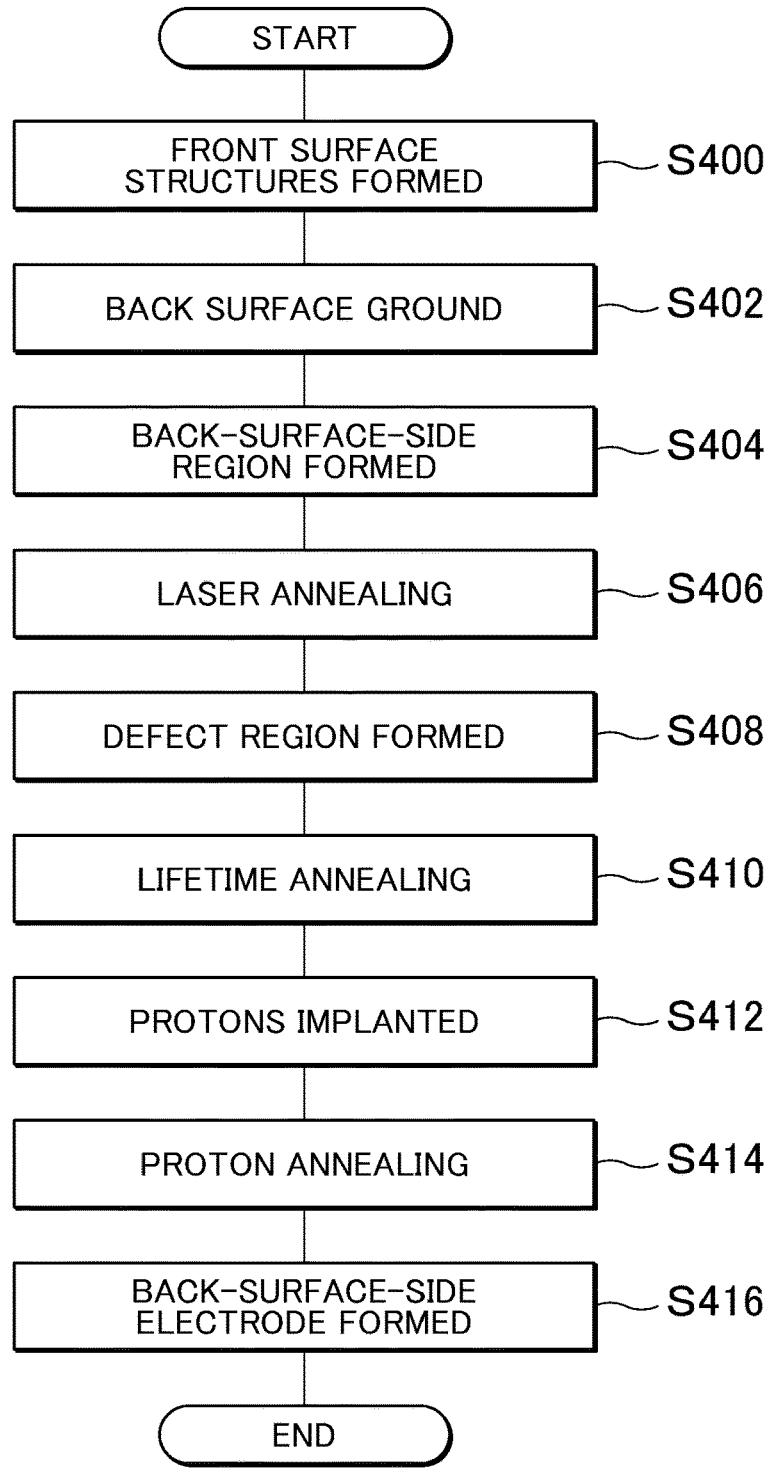
FIG. 10 illustrates one example of a manufacturing method of the semiconductor device 100 according to Example 4.

FIG. 10 illustrates one example of a manufacturing method of the semiconductor device 100 according to Example 4. In the present example, the manufacturing steps are different from those according to Example 1 in that the proton implantation step is performed after the lifetime annealing step. The steps to a laser annealing step in S406 may be the same as S100 to S106 according to Example 1.

In the present example, following the laser annealing step in S406, the semiconductor substrate 10 is irradiated with electron beams (S408). The semiconductor substrate 10 may be irradiated with electron beams from the side of the back surface or from the side of the front surface. After irradiating with electron beams, the semiconductor substrate 10 is annealed under predetermined conditions (S410).

Next, protons are doped from the side of the back surface of the semiconductor substrate 10 to a position deeper than that of the back-surface-side region (S412). In S412, protons may be doped at one or more depth positions. After doping protons, the semiconductor substrate 10 is annealed under predetermined conditions (S414). This allows the peak region 30 including one or more peaks 40 and the high concentration region 32 to be formed. Then, the back-surface-side electrode 104 is formed at the side of the back surface of the semiconductor substrate 10 (S416).

Figure 11:
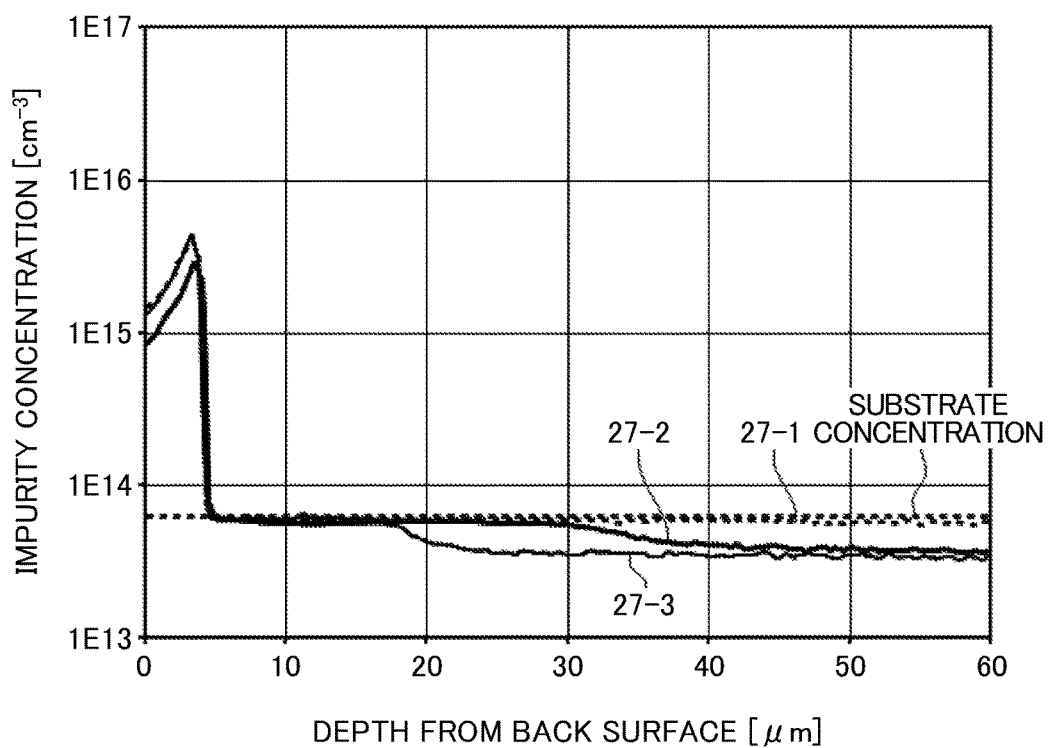
FIG. 11 illustrates an example of the impurity concentration distributions according to Examples 1, 2, 4.

FIG. 11 illustrates an example of the impurity concentration distributions according to Examples 1, 2, 4. In the present example, the impurity concentration distributions 27-1, 27-2 and 27-3 of the semiconductor device 100 formed by using three different manufacturing steps are illustrated. The distribution 27-1 corresponds to the manufacturing method of Example 4, the distribution 27-2 corresponds to that of Example 2, and the distribution 27-3 corresponds to that of Example 1, respectively.

For the distribution 27-1, an irradiation amount of electron beams was set to 400 kGy, an annealing temperature after electron beam irradiation was set to 360 degrees C., an annealing time was set to one hour, an accelerating voltage for accelerating protons was 550 keV, a doping amount of protons was set to $1.0 \times 10^{14}/cm^2$, an annealing temperature after doping protons was set to 360 degrees C., and an annealing time was set to one hour.

For the distribution 27-2, an accelerating voltage for accelerating protons was set to 550 keV, a doping amount of protons was set to $1.0 \times 10^{14}/cm^2$, an irradiation amount of electron beams was set to 400 kGy, an annealing temperature after an irradiation of protons and electron beams was set to 370 degrees C., and an annealing time was set to five hours.

For the distribution 27-3, an accelerating voltage for accelerating protons was set to 550 keV, a doping amount of protons was set to $1.0 \times 10^{14}/cm^2$, an annealing temperature after doping protons was 360 degrees C., an annealing time was set to one hour, an irradiation amount of electron beams was set to 400 kGy, an annealing temperature after electron beam irradiation was set to 360 degrees C., and an annealing time was set to one hour.

For the distribution 27-1, although the annealing temperature was lower and the annealing time was shorter than for the distribution 27-2, the mobility recovered more largely than for the distribution 27-2 by separately performing annealing after electron beam irradiation and annealing after proton implantation. Also, for the distribution 27-1, because annealing after electron beam irradiation was performed more times than for the distribution 27-3, the mobility was recovered more largely than for the distribution 27-3. In this manner, recovery of the mobility can be adjusted by varying the number of times of annealing and intensity of the annealing after electron beam irradiation. It may be selected as appropriate which impurity concentration distribution is to be used depending on required characteristics and the like of the semiconductor device 100.

Example 5

Figure 12:
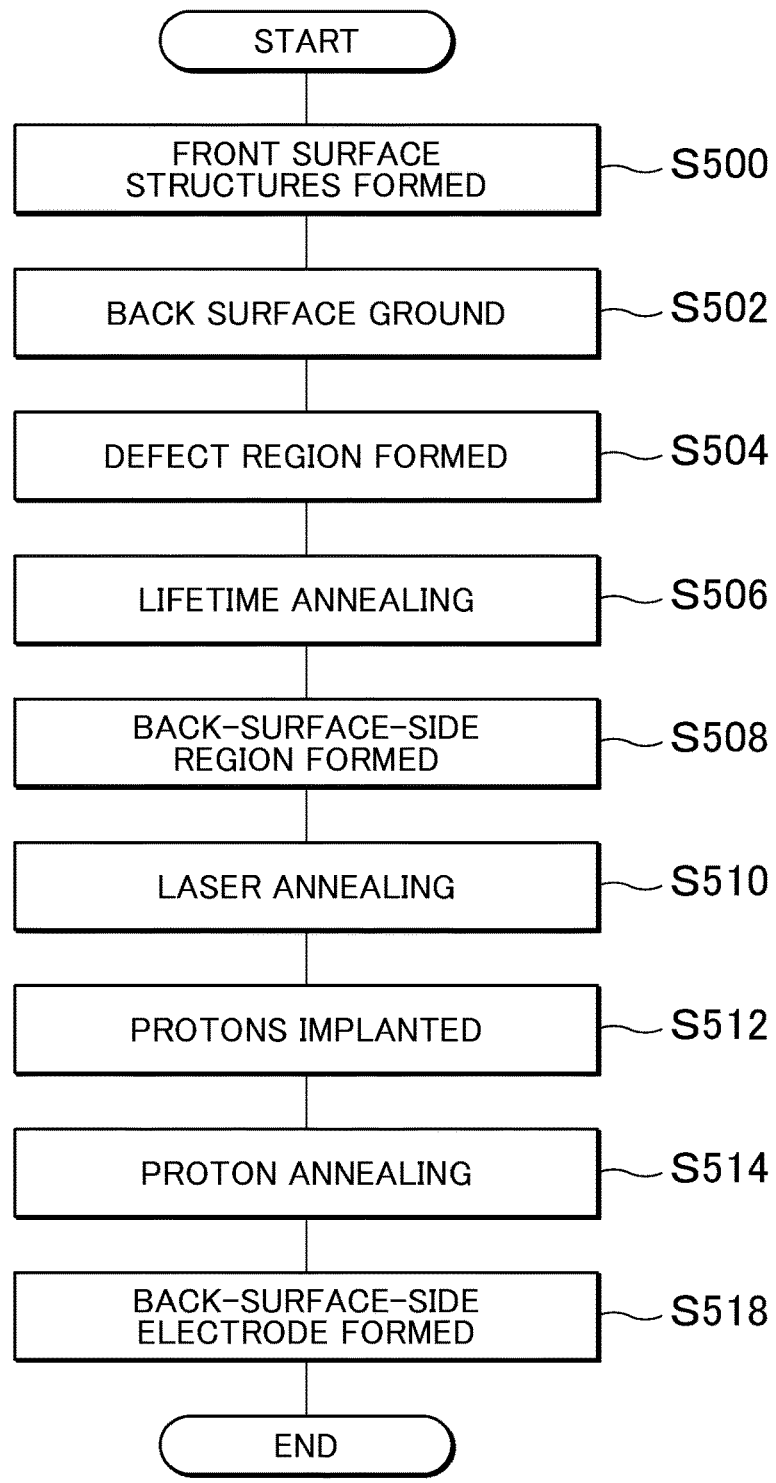
FIG. 12 illustrates one example of a manufacturing method of the semiconductor device 100 according to Example 5.

FIG. 12 illustrates one example of a manufacturing method of the semiconductor device 100 according to Example 5. In the present example, electron beam irradiation is performed before forming of the back-surface-side region. The steps to a back surface grinding step in S502 may be the same as S100 to S102 according to Example 1.

In the present example, following the back surface grinding step in S502, the semiconductor substrate 10 is irradiated with electron beams (S504). The semiconductor substrate 10 may be irradiated with electron beams from the side of the back surface or from the side of the front surface. After irradiating with electron beams, the semiconductor substrate 10 is annealed under predetermined conditions (S506).

Next, the back-surface-side region is formed by doping impurities such as phosphorous from the side of the back surface of the semiconductor substrate 10) to a shallow position (S508). After doping impurities, the back-surface-side region is annealed by a laser and the like (S510).

Next, protons are doped from the side of the back surface of the semiconductor substrate 10 to a position deeper than that of the back-surface-side region (S512). In S512, protons may be doped at one or more depth positions. After doping protons, the semiconductor substrate 10 is annealed under predetermined conditions (S514). This allows the peak region 30 including one or more peaks 40 and the high concentration region 32 to be formed. Then, the back-surface-side electrode 104 is formed at the side of the back surface of the semiconductor substrate 10 (S518).

In this manner, the manufacturing steps of the present example include three annealing steps after electron beam irradiation to increase the intensity of annealing after electron beam irradiation by using an existing annealing step. Therefore, the mobility of the semiconductor device 100 is largely recovered.

Example 6

Figure 13:
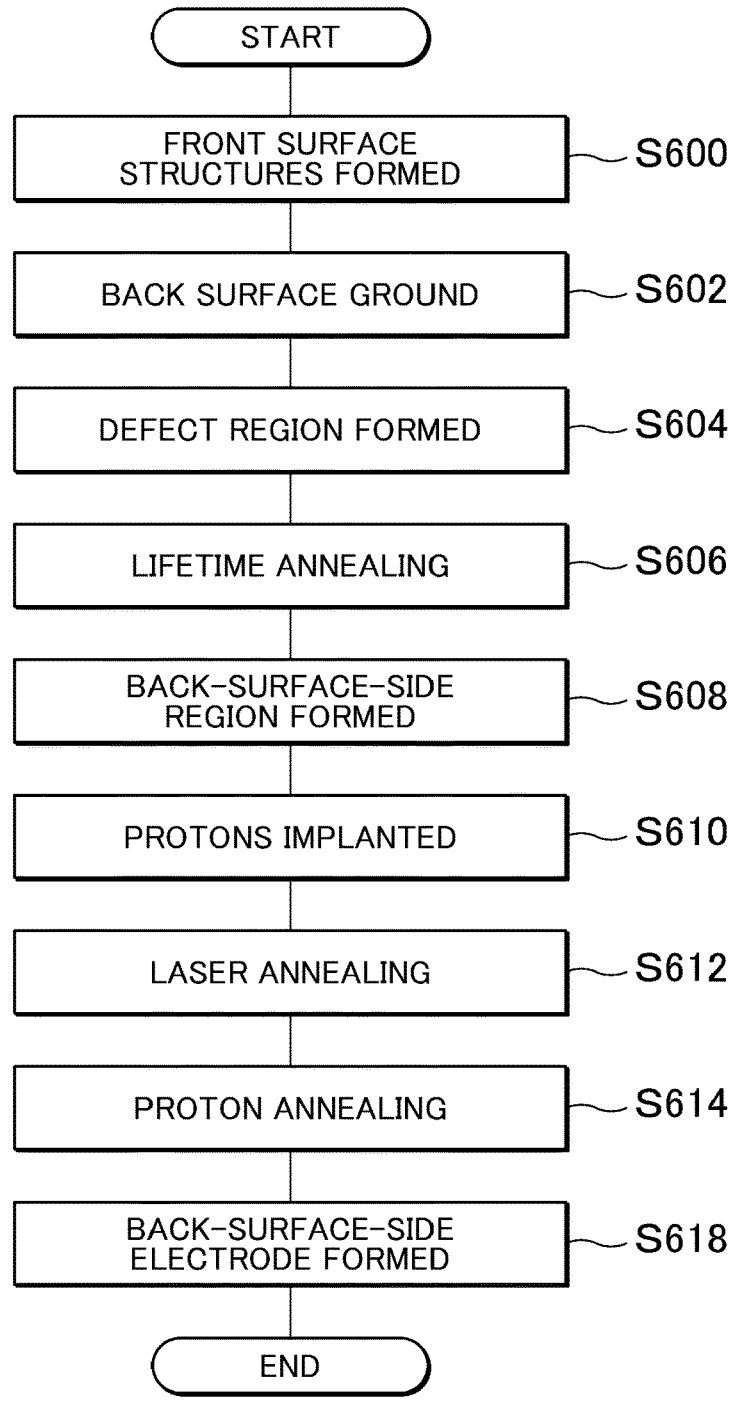
FIG. 13 illustrates one example of a manufacturing method of the semiconductor device 100 according to Example 6.

FIG. 13 illustrates one example of a manufacturing method of the semiconductor device 100 according to Example 6. In the present example, the manufacturing method is different from the one according to Example 5 in that the proton implantation step is performed before the laser annealing step. The steps to a back-surface-side region forming step in S608 may be the same as S500 to S508 according to Example 5.

In the present example, following the back-surface-side region forming step in S608, protons are doped from the side of the back surface of the semiconductor substrate 10 at a position deeper than that of the back-surface-side region (S610). In S610, protons may be doped at one or more depth positions. After doping protons, a laser annealing is performed on the back-surface-side region by a predetermined laser (S612). Next, the semiconductor substrate 10 is annealed under predetermined conditions (S614). This allows the peak region 30 including one or more peaks 40 and the high concentration region 32 to be formed. Then, the back-surface-side electrode 104 is formed at the side of the back surface of the semiconductor substrate 10 (S618).

In this manner, the manufacturing steps of the present example include two annealing steps which are used in existing steps, after proton implantation. This can increase the annealing intensity after proton implantation without additional annealing steps, compared to that of Example 5. This allows the high concentration region 32 to be formed to a deeper position.

An implanting position of helium may be the same as an end position of a region in which the high concentration region 32 is to be formed. Also, the implanting position of helium may be closer to the front surface of the semiconductor substrate 10 than the end of the region in which the high concentration region 32 is to be formed. In this case, in the semiconductor substrate after annealing, the defect region 46 extends closer to the front surface of the semiconductor substrate 10 than the high concentration region 32. This results in more crystal defects remaining in a region closer to the front surface of the semiconductor substrate 10 than the high concentration region 32. This allows the carrier lifetime in the region to be adjusted.

The defect region 46 may extend closer to the front surface of the semiconductor substrate 10 than to a center of the depth direction of the semiconductor substrate 10. Also, the defect region 46 may extend closer to the front surface of the semiconductor substrate 10 than to the peak 40 of the impurity concentration at the deepest position by 40 µm or more, as viewed from the back surface of the semiconductor substrate 10.

Figure 14:
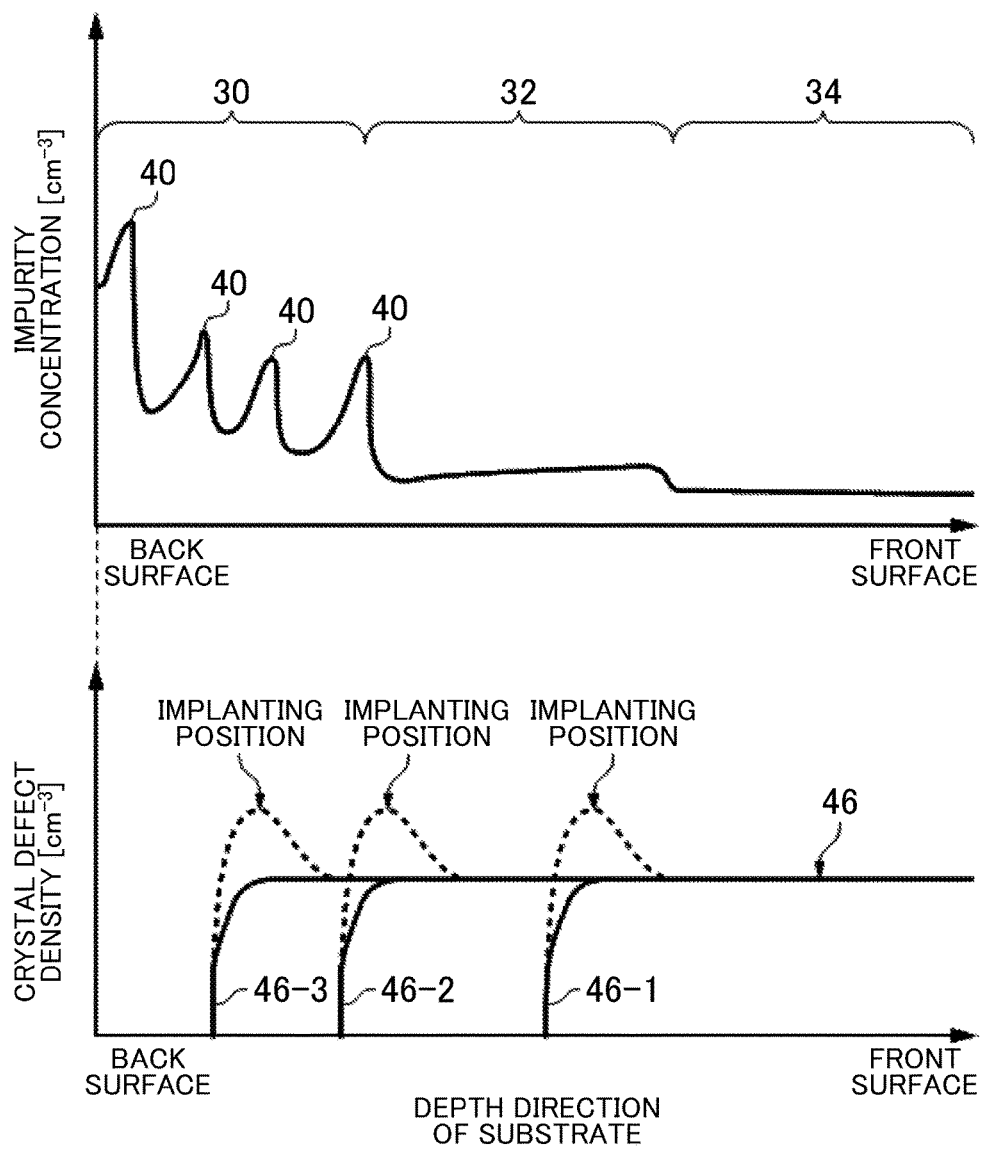
FIG. 14 is a diagram illustrating an example of forming the defect region 46 by implanting helium from the side of the front surface of the semiconductor substrate 10.

FIG. 14 is a diagram illustrating an example of forming the defect region 46 by implanting helium from the side of the front surface of the semiconductor substrate 10. In this case, the defect region 46 is formed in the semiconductor substrate 10 to extend from the front surface of the semiconductor substrate 10 in the depth direction. In FIG. 14, three defect regions 46 are illustrated having different implanting positions of helium, respectively.

The defect region 46-1 has an end at the side of the back surface of the semiconductor substrate 10 formed within the high concentration region 32. That is, a part of the defect region 46-1 and a part of the high concentration region 32 are formed at the same position in the depth direction. Within a region in which the defect region 46-1 is formed, protons are facilitated to be diffused. Therefore, the high concentration region 32 can be formed in a wider range by forming the defect region 46-1 in at least part of the region in which the high concentration region 32 is to be formed.

Note that in FIG. 14, crystal defect densities before protons are diffused are indicated by dotted lines. Before protons are diffused, a peak of the crystal defect density exists near the implanting position of helium. However, protons are diffused by thermal processing so that crystal defects are terminally bonded. This allows the peaks of the crystal defect densities to be gently sloped and suppresses a leak current.

Also, as can be seen from the defect region 46-3, the end of the defect region 46 may extend closer to the back surface of the semiconductor substrate 10 than the peak 40 provided closest to the front surface of the semiconductor substrate 10 in the peak region 30. This allows the defect region 46 to be formed across the entire region in which the high concentration region 32 is to be formed, thereby easily forming the high concentration region 32.

Also, as can be seen from the defect region 46-2, the end of the defect region 46 may also be formed at the same position in the depth direction as the any of the peaks 40 in the peak region 30. In this case, the peak of the crystal defect density near the implanting position of helium can be more gently sloped. Therefore, a leak current can further be suppressed.

Figure 15A:
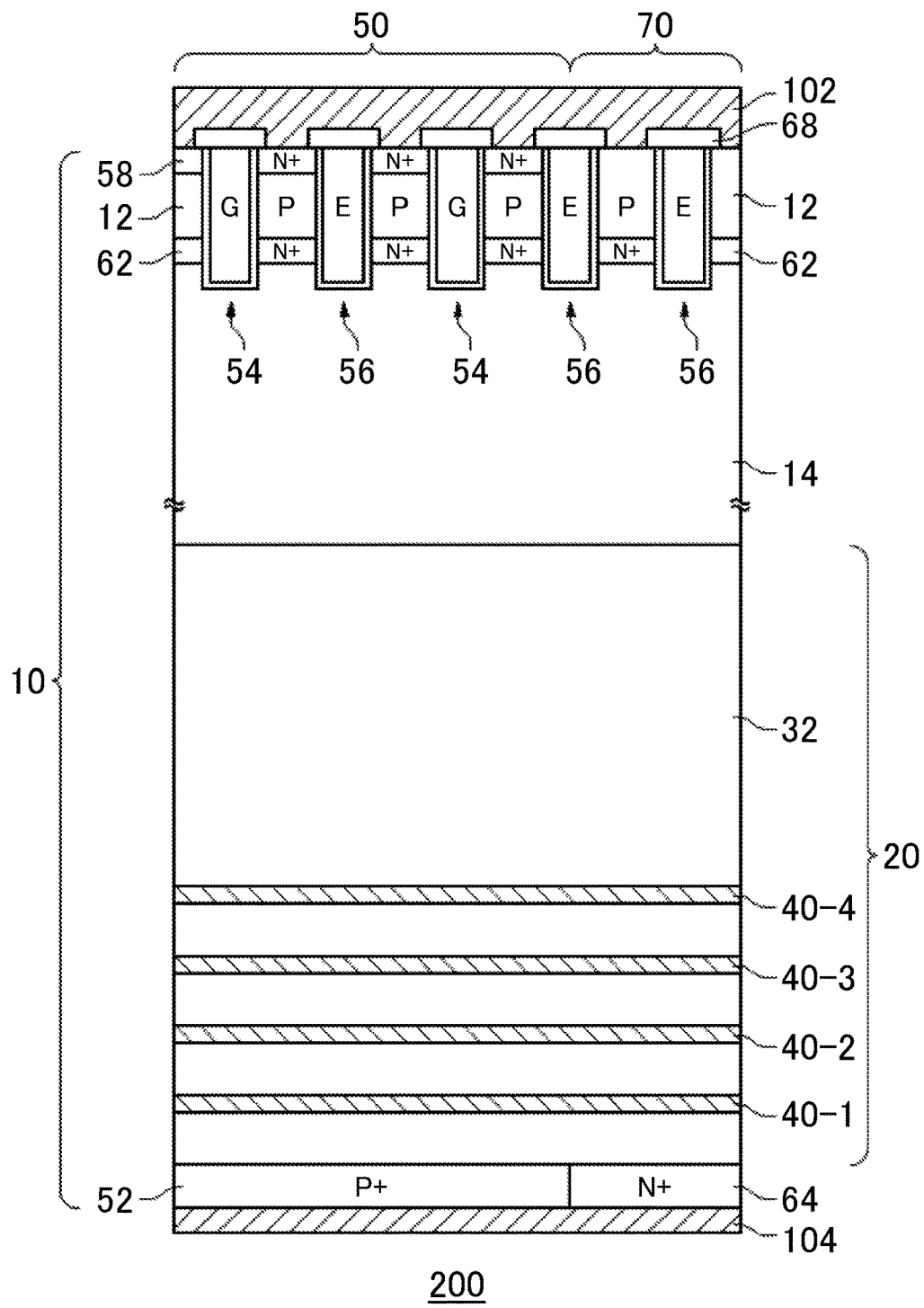
FIG. 15A is a schematic cross-sectional view illustrating a semiconductor device 200 according to a second embodiment of the present invention.

FIG. 15A is a schematic cross-sectional view illustrating a semiconductor device 200 according to a second embodiment of the present invention. The semiconductor substrate 10 of the semiconductor device 200 includes a transistor region 50 in which a transistor such as an IGBT is formed and a diode region 70 in which a diode such as an FWD is formed. In the present example, the transistor region 50 and the diode region 70 are adjacent to each other. As in the present embodiment, the transistor region 50 may be an IGBT.

The transistor region 50 is provided with an emitter region 58 of the N+-type, the front-surface-side region 12 of the P-type which functions as a base region, the drift region 14 of the N--type, the FS region 20, and a collector region 52 of the P+-type, from the proximity of the front surface of the semiconductor substrate 10. Also, an accumulation region 62 of the N+-type may be provided between the front-surface-side region 12 and the drift region 14 to improve an IE effect. Also, not illustrated, but the accumulation region 62 of the N+-type may be formed only in the transistor region 50.

The transistor region 50 is provided with a plurality of gate trenches 54 and a plurality of emitter trenches 56 which reach the drift region 14 from the front surface of the semiconductor substrate 10. Inside the gate trench 54, a gate electrode G is formed to which a gate voltage is applied. Inside the emitter trench 56, an emitter electrode E is formed which is electrically connected to a front-surface-side electrode 102 which functions as an emitter electrode.

An insulating film 68 is formed between the gate electrode G and the emitter electrode E, and the front-surface-side electrode 102. However, in a part of regions in the insulating film 68, a through hole is formed to connect the emitter electrode E and the front-surface-side electrode 102.

The diode region 70 is provided with the front-surface-side region 12 of the P-type which functions as a base region, the drift region 14 of the N--type, the FS region 20, and a cathode region 64 of the N+-type, from the proximity of the front surface of the semiconductor substrate 10. The accumulation region 62 may be formed or may not be formed in the diode region 70. The peak region including a plurality of peaks 40 is formed in the FS region 20 of the transistor region 50 and the diode region 70. The diode region 70 is provided with a plurality of emitter trenches 56 which reach the drift region 14 from the front surface of the semiconductor substrate 10. Also, on the back surface of the semiconductor substrate 10, a back-surface-side electrode 104 is formed to contact the collector region 52 and the cathode region 64.

In the semiconductor device 200 of the present example, the entire semiconductor substrate 10 is irradiated with electron beams to form the defect region. This allows the high concentration region 32 to be formed in the transistor region 50 and the diode region 70.

Figure 15B:
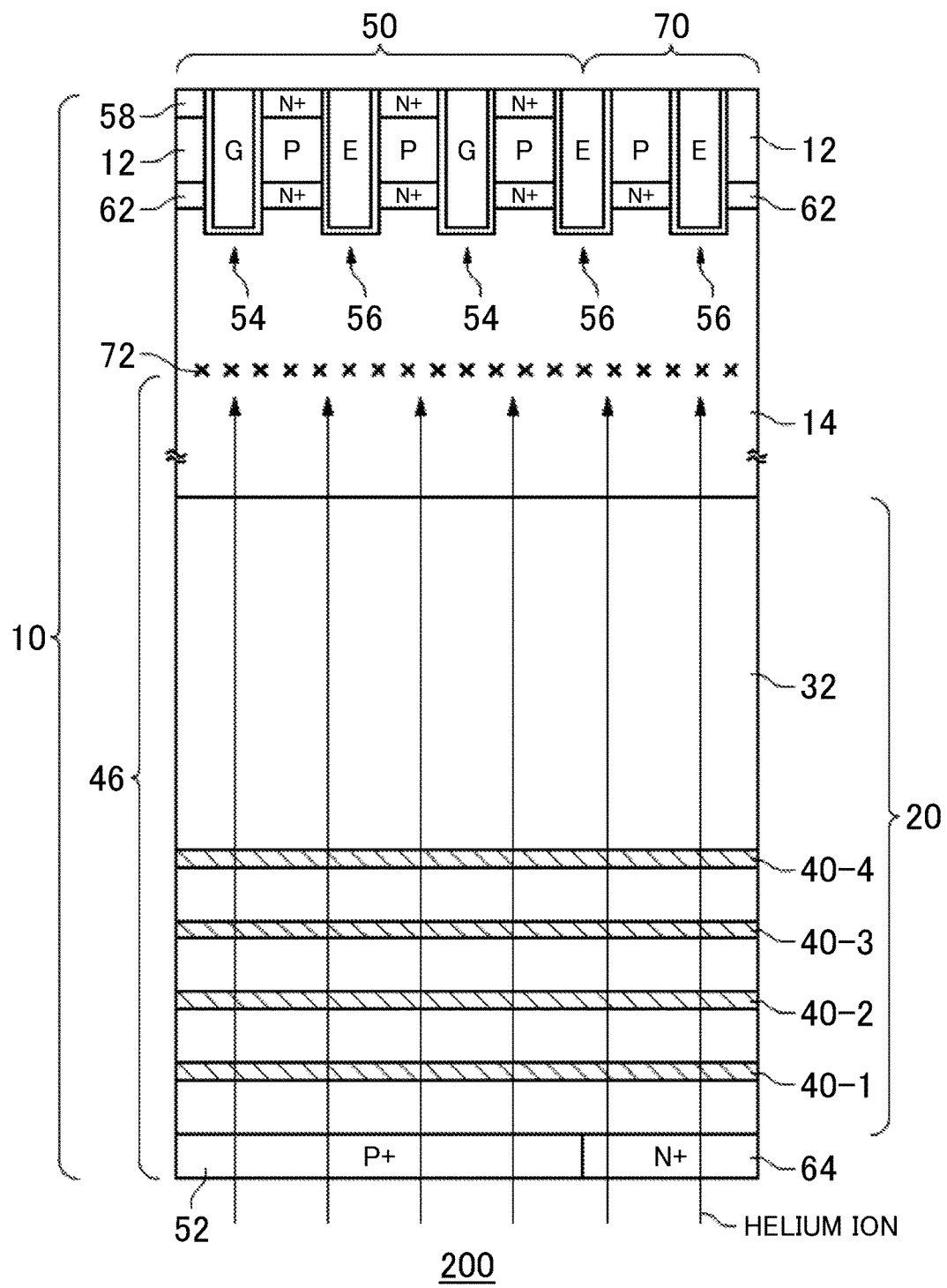
FIG. 15B is a diagram illustrating another example of the semiconductor device 200.

FIG. 15B is a diagram illustrating another example of the semiconductor device 200. FIG. 15B only illustrates the semiconductor substrate 10. The semiconductor device 200 of the present example is implanted with helium ions from the side of the back surface of the semiconductor substrate 10 to form the defect region. The other structures are similar to those of the semiconductor device 200 illustrated in FIG. 15A. Note that in the present example, the entire region of the transistor region 50 and the diode region 70 is implanted with helium ions. An implanting position 72 of helium ions is closer to the front surface of the semiconductor substrate 10 than the region in which the high concentration region 32 is to be formed.

The defect region 46 is formed between the back surface of the semiconductor substrate 10 and the implanting position 72 by implanting helium ions from the side of the back surface of the semiconductor substrate 10. After forming the defect region 46 and implanting the peak region 30 with protons, the semiconductor substrate 10 is annealed. This allows the high concentration region 32 to be formed in the transistor region 50 and the diode region 70.

Figure 15C:
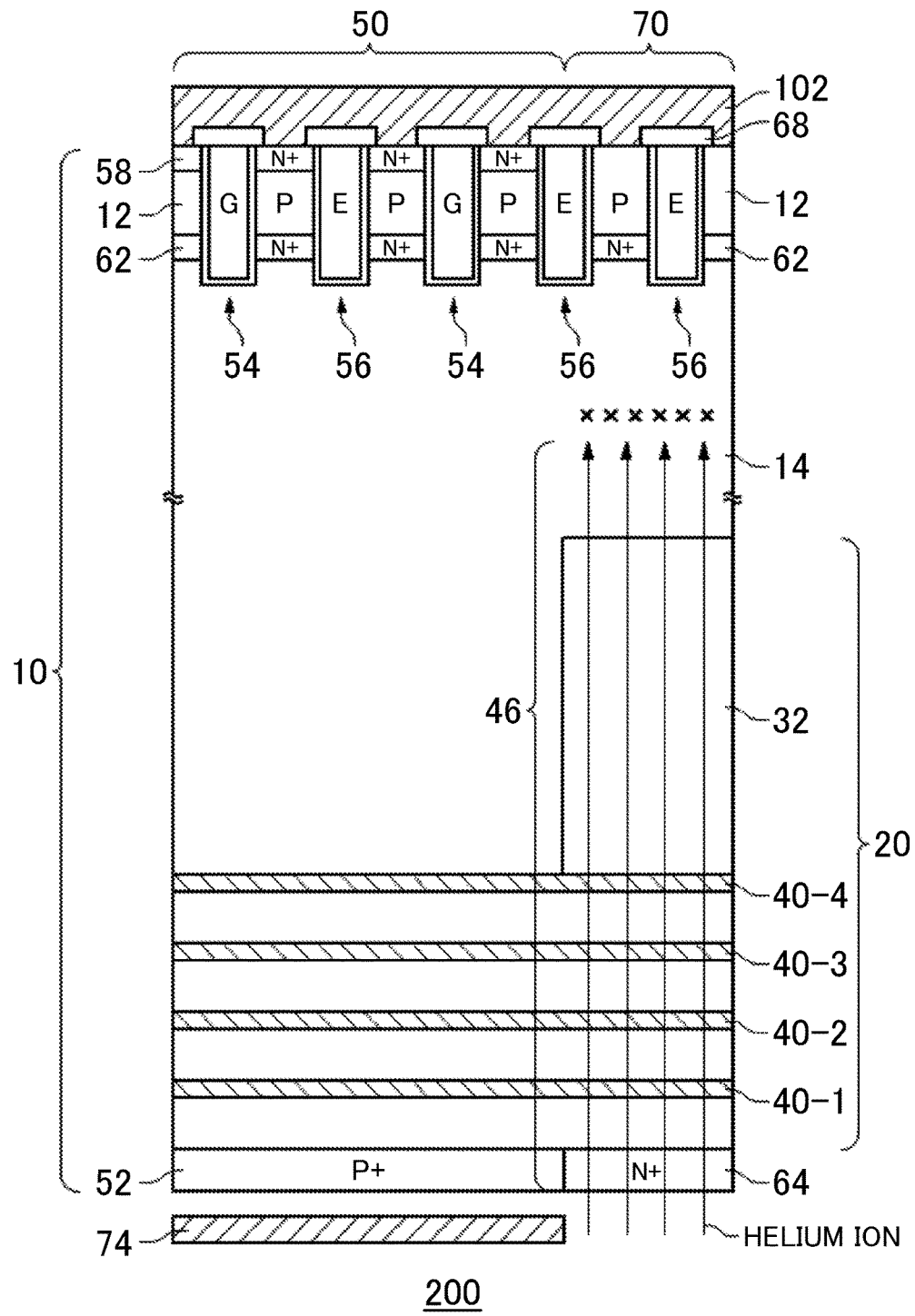
FIG. 15C is a diagram illustrating another example of the semiconductor device 200.

FIG. 15C is a diagram illustrating another example of the semiconductor device 200. FIG. 15C illustrates the semiconductor substrate 10. The semiconductor device 200 of the present example is implanted with helium ions from the side of the back surface of the semiconductor substrate 10 to form the defect region. The other structures are similar to those of the semiconductor device 200 illustrated in FIG. 15A. Note that in the present example, the diode region 70 is implanted with helium ions, while the transistor region 50 is not implanted with helium ions. As one example, in implanting of helium ions, a metal mask 74 is used to mask the transistor region 50. The implanting position 72 of helium ions is closer to the front surface of the semiconductor substrate 10 than the region in which the high concentration region 32 is to be formed.

The defect region 46 is formed between the back surface and the implanting position 72 of the semiconductor substrate 10 by implanting helium ions from the side of the back surface of the semiconductor substrate 10. After forming the defect region 46 and implanting the peak region 30 with protons, the semiconductor substrate 10 is annealed. This allows the high concentration region 32 to be formed in the diode region 70 but not in the transistor region 50.

For the boundary between the high concentration region 32 and the drift region 14, a position of the boundary at which the high concentration region 32 and the drift region 14 are adjacent to each other in a horizontal plane direction (a lateral direction on the paper) may be closer to the transistor region 50 or may be closer to the diode region 70 than a position of the boundary between the collector region 52 and the cathode region 64 on a horizontal plane (in a planar view).

Also, not only limited to helium ions, but also electron beams may be irradiated. In this case, the metal mask just needs to be thick enough to shield electron beams.

Figure 15D:
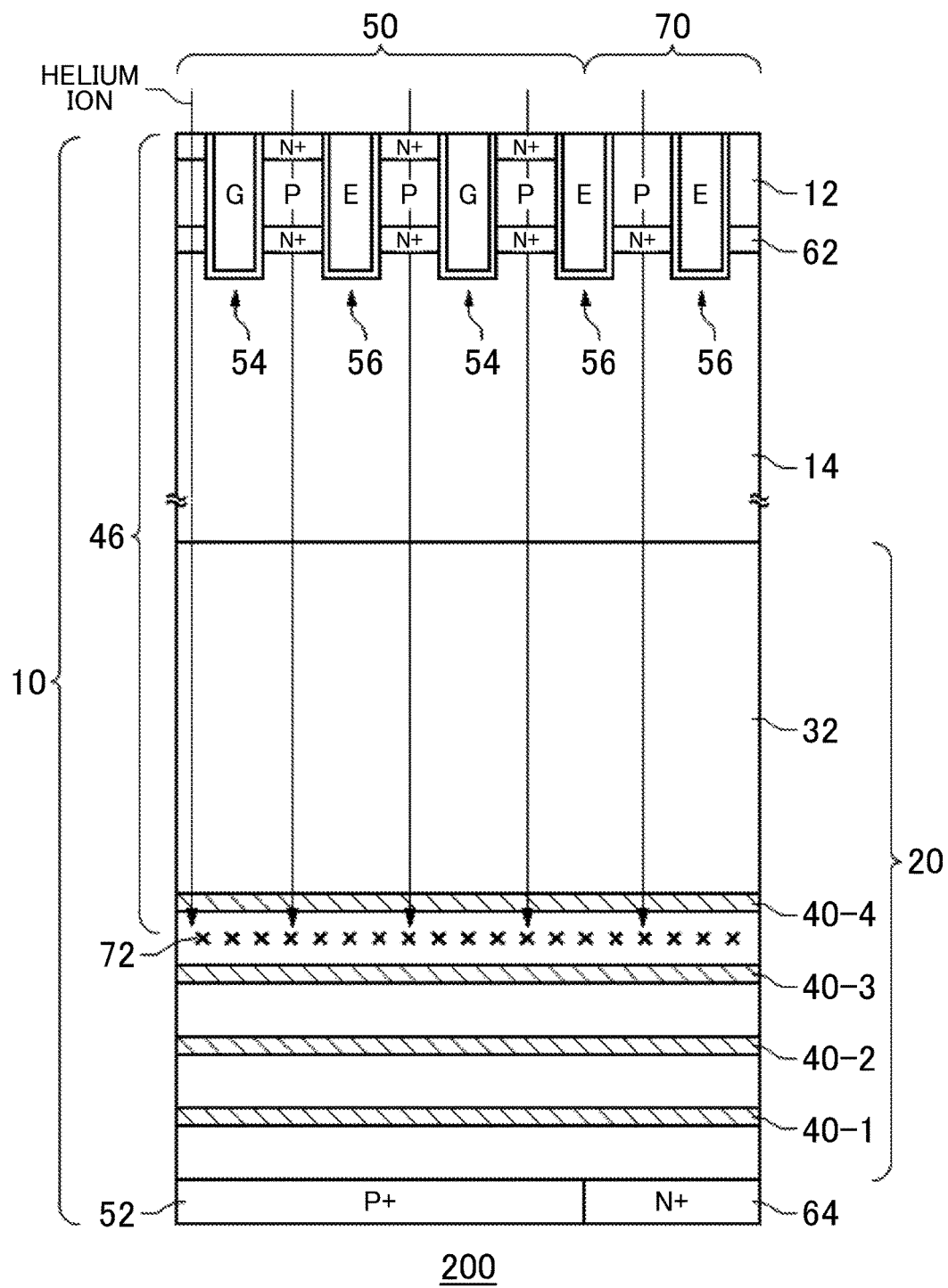
FIG. 15D is a diagram illustrating another example of the semiconductor device 200.

FIG. 15D is a diagram illustrating another example of the semiconductor device 200. FIG. 15D only illustrates the semiconductor substrate 10. The semiconductor device 200 of the present example is implanted with helium ions from the side of the front surface of the semiconductor substrate 10 to form the defect region. The other structures are similar to those of the semiconductor device 200 illustrated in FIG. 15A. Note that in the present example, the entire region of the transistor region 50 and the diode region 70 is implanted with helium ions. The implanting position 72 of helium ions is, for example, any of positions in the peak region 30.

The defect region 46 is formed between the front surface and the implanting position 72 of the semiconductor substrate 10 by implanting helium ions from the side of the front surface of the semiconductor substrate 10. After forming the defect region 46 and implanting the peak region 30 with protons, the semiconductor substrate 10 is annealed. This allows the high concentration region 32 to be formed in the transistor region 50 and the diode region 70.

Figure 15E:
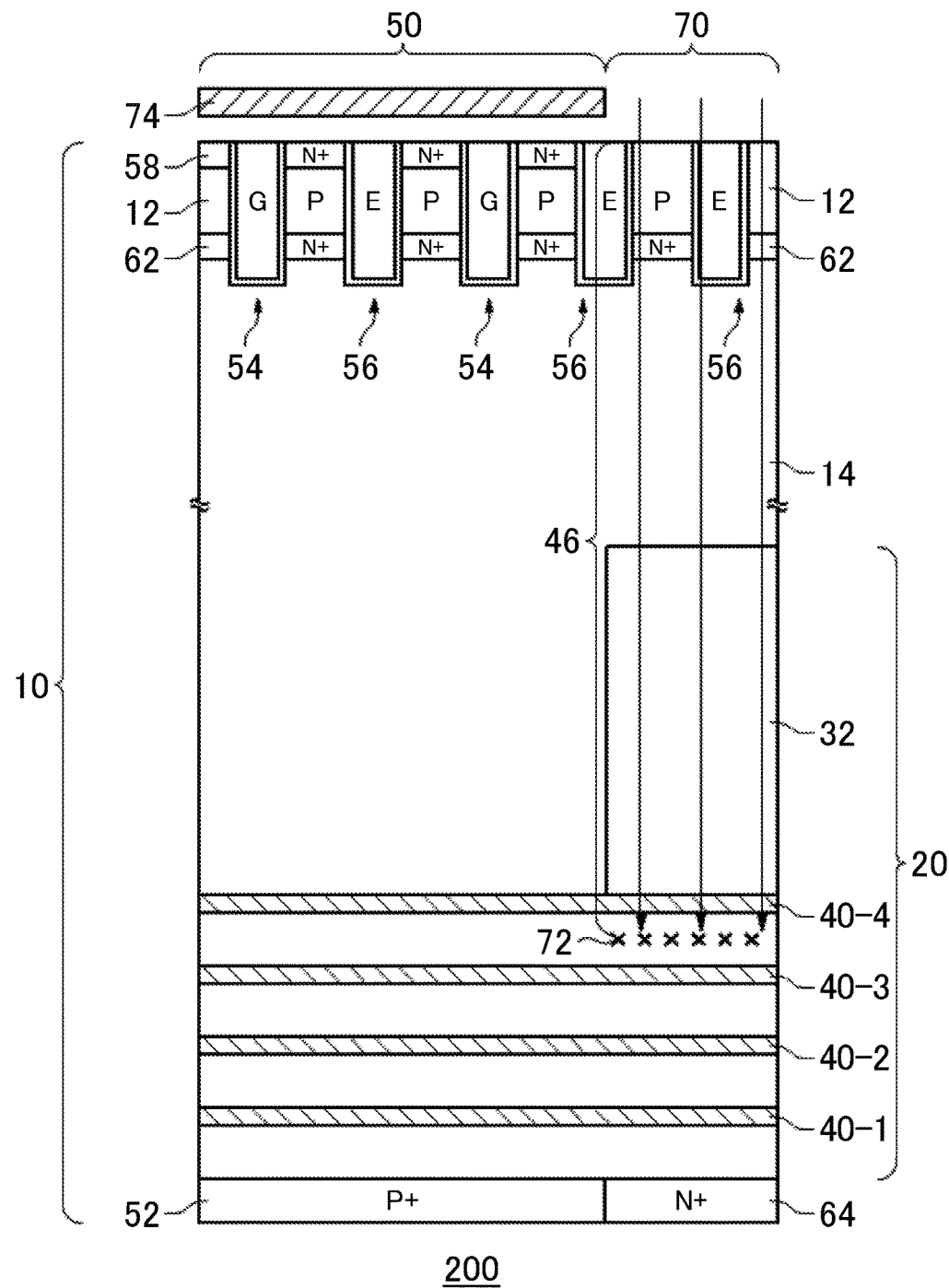
FIG. 15E is a diagram illustrating another example of the semiconductor device 200.

FIG. 15E is a diagram illustrating another example of the semiconductor device 200. FIG. 15E only illustrates the semiconductor substrate 10. The semiconductor device 200 of the present example is implanted with helium ions from the side of the front surface of the semiconductor substrate 10 to form the defect region. The other structures are similar to those of the semiconductor device 200 illustrated in FIG. 15A. Note that in the present example, the diode region 70 is implanted with helium ions, while the transistor region 50 is not implanted with helium ions. As one example, in implanting of helium ions, the metal mask 74 is used to mask the transistor region 50. The implanting position 72 of helium ions is, for example, any of positions in the peak region 30.

The defect region 46 is formed between the front surface and the implanting position 72 of the semiconductor substrate 10 by implanting helium ions from the side of the front surface of the semiconductor substrate 10. After forming the defect region 46 and implanting the peak region 30 with protons, the semiconductor substrate 10 is annealed. This allows the high concentration region 32 to be formed in the diode region 70 but not in the transistor region 50.

Figure 15F:
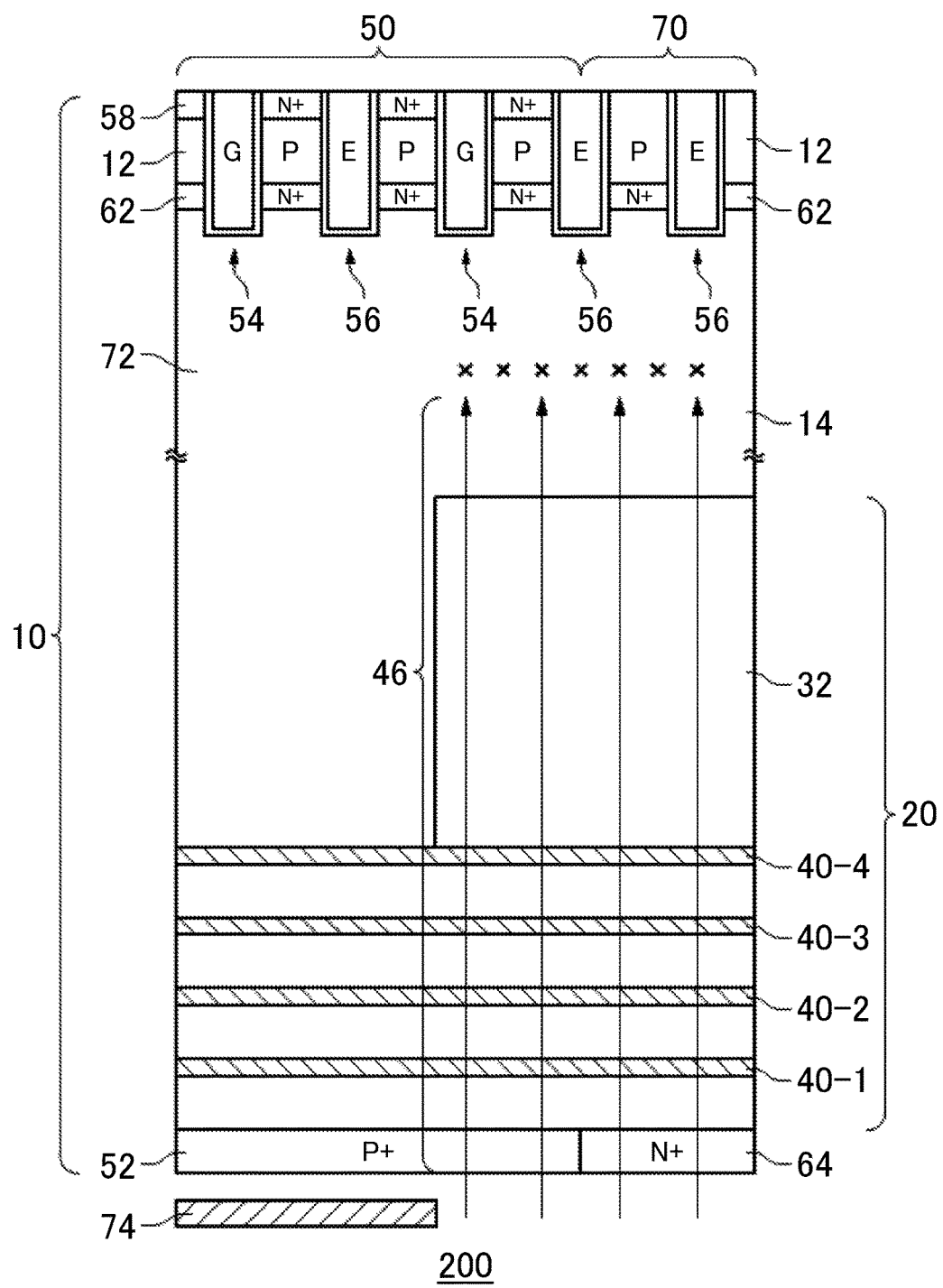
FIG. 15F is a diagram illustrating another example of the semiconductor device 200.

FIG. 15F is a diagram illustrating another example of the semiconductor device 200. FIG. 15F only illustrates the semiconductor substrate 10. The semiconductor device 200 of the present example is implanted with helium ions from the side of the back surface of the semiconductor substrate 10 to form the defect region. The other structures are similar to those of the semiconductor device 200 illustrated in FIG. 15A. Note that in the present example, helium ions are implanted in the diode region 70 and a partial region of the transistor region 50 adjacent to the diode region 70, while helium ions are not implanted in a partial region of the transistor region 50 apart from the diode region 70. As one example, in implanting of helium ions, the metal mask 74 is used to mask the transistor region 50. The implanting position 72 of helium ions is closer to the front surface of the semiconductor substrate 10 than the region in which the high concentration region 32 is to be formed.

The defect region 46 is formed between the back surface of the semiconductor substrate 10 and the implanting position 72 by implanting helium ions from the side of the back surface of the semiconductor substrate 10. After forming the defect region 46 and implanting the peak region 30 with protons, the semiconductor substrate 10 is annealed. This allows the high concentration region 32 to be formed in the diode region 70 and a partial region of the transistor region 50, but not in the remaining region of the transistor region 50. Note that in the semiconductor device 200 illustrated in FIG. 15E, the high concentration region 32 may be formed in a partial region of the transistor region 50.

Also, the semiconductor substrate 10 illustrated in FIG. 1A to FIG. 15F may be an MCZ (Magnetic Field Applied Czochralski method) substrate. The MCZ substrate has an oxygen concentration higher than an FZ substrate. With a higher oxygen concentration, the semiconductor substrate irradiated with electron beams 10 includes relatively more VO defects and relatively fewer VV defects. VO defects tend to be terminally attached to hydrogen, thereby diffusing protons easily to form the high concentration region 32 to a deep position.

Also, if protons are diffused, VO defects are terminally attached to protons to be VOH defects. Therefore, the MCZ substrate in which protons are diffused includes more VOH defects than VV defects. VOH defects are in a shallower level than VV defects, and thus hard to contribute leak currents. Therefore, if protons are diffused in the MCZ substrate, leak currents can be decreased.

Figure 16:
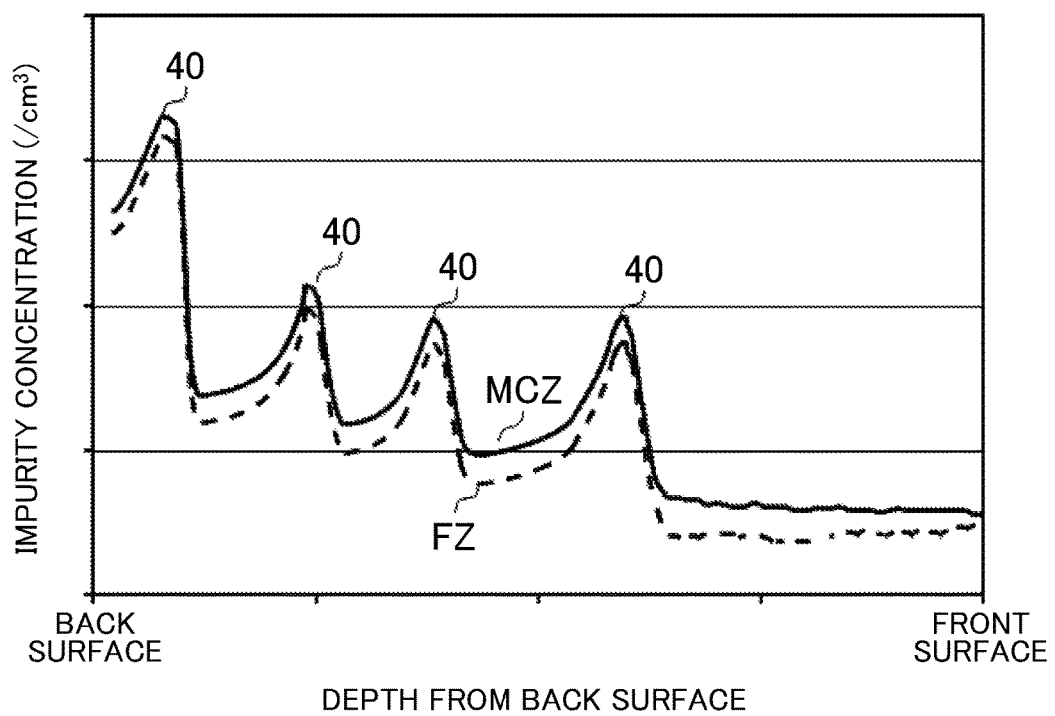
FIG. 16 is a diagram illustrating one example of the impurity concentration distributions, one with the MCZ substrate irradiated with electron beams and one with the FZ substrate irradiated with electron beams.

FIG. 16 is a diagram illustrating one example of the impurity concentration distributions, one with the MCZ substrate irradiated with electron beams and one with the FZ substrate irradiated with electron beams. In the present example, protons were implanted at four-step depths. In the example using the MCZ substrate and the example using the FZ substrate, the substrates are of the same resistivity. Also, conditions other than material of the substrate, such as conditions of proton implantation and conditions of electron beam irradiation, were the same.

As shown in FIG. 16, the impurity concentration is higher in a region closer to the front surface than the peak 40 of protons, by using the MCZ substrate. Therefore, the high concentration region can be formed easily. Also, in the semiconductor device 100 using the MCZ substrate, leak currents were decreased compared to the device using the FZ substrate. Also, even if compared to the example in which the MCZ substrate was irradiated with electron beams but not implanted with protons, leak currents were decreased in the semiconductor device 100 using the MCZ substrate.

Note that the semiconductor substrate 10 may also be a substrate having an average oxygen concentration of $1.0 \times 10^{16}/cm^3$ or more and $1.0 \times 10^{18}/cm^3$ or less. This also achieves the effect similar to the MCZ substrate. An average oxygen concentration of the semiconductor substrate 10 may be $3.0 \times 10^{16}/cm^3$ or more and $5.0 \times 10^{17}/cm^3$ or less.

Also, the semiconductor substrate 10 may be a substrate having an average carbon concentration of $1.0 \times 10^{14}/cm^3$ or more and $3.0 \times 10^{15}/cm^3$ or less. Also, the substrate may have both of the average oxygen concentration and the average carbon concentration within the ranges described above.

While the embodiments of the present invention have been described, the technical scope of the invention is not limited to the above described embodiments. For example, point defects were introduced by electron beam irradiation in the example. However, they may also be introduced by helium irradiation. In this case, helium just needs to be irradiated at an accelerating energy to travel deeper than the range of hydrogen. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: front-surface-side region, 14: drift region, 15: gate section, 20: FS region, 21: cathode region, 23, 24, 25, 26, 27: distribution, 30: peak region, 31: collector region, 32: high concentration region, 34: low concentration region, 40: peak, 46: defect region, 50: transistor region, 52: collector region, 54: gate trench, 56: emitter trench, 58: emitter region, 62: accumulation region, 64: cathode region, 68: insulating film, 70: diode region, 72: implanting position, 74: mask, 100: semiconductor device, 102: front-surface-side electrode, 104: back-surface-side electrode, 200: semiconductor device

What is claimed is:

1. A semiconductor device comprising:
    a semiconductor substrate having a substantially uniform concentration of an N-type impurity;
    a front-surface-side electrode provided at a side of a front surface of the semiconductor substrate; and
    a back-surface-side electrode provided at a side of a back surface of the semiconductor substrate;
    wherein the semiconductor substrate includes:
    a back surface layer of a P-type or N-type semiconductor, on which the back-surface-side electrode is provided,
    a peak region adjacent to the back surface layer, arranged at the side of the back surface of the semiconductor substrate and having one or more peaks of an impurity concentration;
    a high concentration region arranged closer to the front surface than the peak region and having an impurity concentration distribution more gently sloped than the one or more peaks; and
    a low concentration region arranged closer to the front surface than the high concentration region, having an impurity concentration lower than the impurity concentration of the high concentration region, and having an impurity concentration lower than the concentration of the N-type impurity of the semiconductor substrate.

2. The semiconductor device according to claim 1, wherein the impurity concentration of the high concentration region is equal to or higher than the concentration of the N-type impurity of the semiconductor substrate.

3. The semiconductor device according to claim 1, wherein the impurity concentration of the high concentration region is equal to the concentration of the N-type impurity of the semiconductor substrate.

4. The semiconductor device according to claim 1, wherein
    the high concentration region includes a first carrier lifetime region,
    the low concentration region includes a second carrier lifetime region,
    a carrier lifetime of the second carrier lifetime region is shorter than a carrier lifetime of the first carrier lifetime region,
    a point defect concentration of the second carrier lifetime region is higher than a point defect concentration of the first carrier lifetime region, and
    the semiconductor substrate includes a transition region between the first carrier lifetime region and the second carrier lifetime region.

5. The semiconductor device according to claim 4, wherein the carrier lifetime of the first carrier lifetime region is 10 µs or more and the carrier lifetime of the second carrier lifetime region is 0.1 µs or less.

6. The semiconductor device according to claim 4, wherein a length of the transition region in a depth direction is 5 µm or more.

7. The semiconductor device according to claim 4, wherein a length of the transition region in a depth direction is longer than a half width at half maximum of the peak closest to the back surface.

8. The semiconductor device according to claim 4, wherein a length of the transition region in a depth direction is longer than a length of a P-type semiconductor layer of the semiconductor substrate in the depth direction.

9. The semiconductor device according to claim 1, wherein the semiconductor substrate is an MCZ substrate.

10. The semiconductor device according to claim 1, wherein an average oxygen concentration of the semiconductor substrate is $1.0 \times 10^{16}/cm^3$ or more and $1.0 \times 10^{18}/cm^3$ or less.

11. The semiconductor device according to claim 1, wherein the semiconductor substrate further includes a defect region formed to extend in a depth direction from the front surface of the semiconductor substrate.

12. The semiconductor device according to claim 11, wherein a part of the defect region and a part of the high concentration region are formed at same position in the depth direction.

13. The semiconductor device according to claim 12, wherein an end of the defect region extends closer to the back surface of the semiconductor substrate than the peak provided closest to the front surface of the semiconductor substrate in the peak region.

14. The semiconductor device according to claim 12, wherein an end of the defect region is formed at the same position in the depth direction as any of the peaks in the peak region.

15. The semiconductor device according to claim 1, wherein the semiconductor substrate further includes a defect region formed to extend in a depth direction from the back surface of the semiconductor substrate.

16. The semiconductor device according to claim 15, wherein the defect region extends closer to the front surface of the semiconductor substrate than the high concentration region.

17. The semiconductor device according to claim 1, wherein the semiconductor substrate includes a transistor region having a transistor formed therein and a diode region having a diode formed therein, and wherein the high concentration region is formed in the diode region.

18. The semiconductor device according to claim 17, wherein the high concentration region is further formed in the transistor region.

19. The semiconductor device according to claim 17, wherein the high concentration region is not formed in the transistor region.

20. The semiconductor device according to claim 1, wherein the high concentration region and the peak region are regions which include a donor of a vacancy-oxygen-hydrogen defect formed therein.

21. The semiconductor device according to claim 4, wherein
    the transition region includes a boundary between a P-type semiconductor layer and an N-type semiconductor layer of the semiconductor substrate.

22. The semiconductor device according to claim 1, wherein
    the peak region includes a concentration distribution in which an impurity concentration decreases in a direction of the front surface of the semiconductor substrate and in a direction of the back surface of the semiconductor substrate.

23. The semiconductor device according to claim 1, wherein
    a mobility of carriers in the low concentration region is lower than a mobility of carriers in the high concentration region.

24. The semiconductor device according to claim 1, wherein
    the high concentration region includes hydrogen-terminated dangling bonds.

25. The semiconductor device according to claim 1, wherein
    the impurity concentration of the low concentration region is uniform and lower than the minimum impurity concentration of the high concentration region and the peak region.

26. The semiconductor device according to claim 25, wherein
    the low concentration region is adjacent the high concentration region which is adjacent the peak region.

27. The semiconductor device according to claim 26, wherein
    the impurity concentration of the high concentration region is uniform.

28. The semiconductor device according to claim 1, further comprising:
    a drift region arranged closer to the front surface than the low concentration region, having the same impurity concentration as the low concentration region, and having fewer defects than the low concentration region.

29. The semiconductor device of claim 1, wherein
    the low concentration region has more defects than the high concentration region.

30. The semiconductor device according to claim 1, wherein the impurity of the semiconductor substrate is phosphorous.

* * * * *